(12) United States Patent
Nakata et al.

(10) Patent No.: US 10,277,847 B2
(45) Date of Patent: Apr. 30, 2019

(54) SOLID-STATE IMAGING DEVICE, ELECTRONIC APPARATUS, LENS CONTROL METHOD, AND IMAGING MODULE

(71) Applicant: SONY CORPORATION, Tokyo (JP)

(72) Inventors: Masashi Nakata, Kanagawa (JP); Koji Takahashi, Nagasaki (JP); Yuuji Inoue, Nagasaki (JP); Kenji Ikeda, Kumamoto (JP); Osamu Oka, Kumamoto (JP); Yoshiro Hattori, Kanagawa (JP); Shinya Sato, Kumamoto (JP); Hideaki Kato, Nagasaki (JP); Yasuhiro Chouji, Nagasaki (JP); Emi Nishioka, Nagasaki (JP); Hiroshi Kawanobe, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 516 days.

(21) Appl. No.: 14/890,460

(22) PCT Filed: May 27, 2014

(86) PCT No.: PCT/JP2014/002799
§ 371 (c)(1),
(2) Date: Nov. 11, 2015

(87) PCT Pub. No.: WO2014/196160
PCT Pub. Date: Dec. 11, 2014

(65) Prior Publication Data
US 2016/0088245 A1    Mar. 24, 2016

(30) Foreign Application Priority Data

Jun. 4, 2013   (JP) .................................. 2013-117688

(51) Int. Cl.
*H04N 5/369* (2011.01)
*H04N 5/232* (2006.01)
(Continued)

(52) U.S. Cl.
CPC ..... *H04N 5/3696* (2013.01); *H01L 27/14621* (2013.01); *H01L 27/14623* (2013.01);
(Continued)

(58) Field of Classification Search
CPC ...... H04N 5/3696; H04N 5/369; H04N 5/232; H04N 5/23212; H04N 9/045;
(Continued)

(56) References Cited

U.S. PATENT DOCUMENTS 7,863,550 B2 *  1/2011  Kusaka ................. G02B 7/346
                                                                       250/201.8
8,810,713 B2 *  8/2014  Matsuo ................ H04N 5/3696
                                                                      348/345

(Continued)

FOREIGN PATENT DOCUMENTS

CN        101952709 A     1/2011
CN        102227665 A    10/2011
(Continued)

OTHER PUBLICATIONS

Office Action for JP Patent Application No. 2013-117688, dated Nov. 29, 2016, 10 pages.

(Continued)

*Primary Examiner* — John R Lee
(74) *Attorney, Agent, or Firm* — Chip Law Group

(57) ABSTRACT

There is provided a solid-state imaging device including: a pixel region that includes a plurality of pixels arranged in a two-dimensional matrix pattern. Some of the plurality of pixels are configured to be phase difference detection pixels that include a photoelectric conversion section disposed on (Continued)

a semiconductor substrate and a light blocking film disposed above a portion of the photoelectric conversion section. In particular a location of the light blocking film for the phase difference detection pixels varies according to a location of the phase difference detection pixel. For example, the location of the light blocking film for a phase difference detection pixel positioned at a periphery of the pixel region is different than a location of the light blocking film for a phase difference detection pixel positioned in a center portion of the pixel region.

36 Claims, 31 Drawing Sheets

(51) Int. Cl.
    *H01L 27/146*     (2006.01)
    *H04N 9/04*     (2006.01)
    *H04N 13/00*     (2018.01)
    *G02B 7/34*     (2006.01)
    *H04N 5/225*     (2006.01)

(52) U.S. Cl.
    CPC ... *H01L 27/14627* (2013.01); *H04N 5/23212* (2013.01); *H04N 9/045* (2013.01); *H04N 13/0022* (2013.01); *G02B 7/346* (2013.01); *H04N 2005/2255* (2013.01)

(58) Field of Classification Search
    CPC ........ H04N 13/0022; H04N 2005/2255; H01L 27/146; H01L 27/14623; H01L 27/14627; H01L 27/14621; G02B 7/28; G02B 7/282; G02B 7/34; G02B 7/346
    See application file for complete search history.

(56) References Cited

U.S. PATENT DOCUMENTS

| | | | |
|---|---|---|---|
| 9,160,918 B2* | 10/2015 | Nagano | H04N 5/23212 |
| 9,167,148 B2* | 10/2015 | Onuki | H04N 5/23212 |
| 2002/0102103 A1 | 8/2002 | Kindaichi et al. | |
| 2005/0236553 A1* | 10/2005 | Noto | H01L 27/14621 |
| | | | 250/208.1 |
| 2009/0295964 A1 | 12/2009 | Utagawa et al. | |
| 2010/0045849 A1* | 2/2010 | Yamasaki | G03B 3/10 |
| | | | 348/349 |
| 2010/0245631 A1* | 9/2010 | Hoda | G03B 13/36 |
| | | | 348/241 |
| 2010/0302432 A1* | 12/2010 | Komuro | H04N 5/23212 |
| | | | 348/340 |
| 2011/0096212 A1* | 4/2011 | Oikawa | G03B 13/36 |
| | | | 348/273 |
| 2011/0169997 A1* | 7/2011 | Nagano | G02B 3/0056 |
| | | | 348/340 |
| 2013/0016274 A1 | 1/2013 | Matsuo et al. | |
| 2013/0169858 A1* | 7/2013 | Yamasaki | G03B 3/10 |
| | | | 348/350 |
| 2013/0235253 A1* | 9/2013 | Onuki | H04N 5/3696 |
| | | | 348/349 |
| 2016/0088245 A1* | 3/2016 | Nakata | H04N 9/045 |
| | | | 250/201.2 |
| 2016/0309102 A1* | 10/2016 | Koizumi | H04N 5/3696 |
| 2017/0163875 A1* | 6/2017 | Takao | H04N 5/23212 |
| 2017/0272643 A1* | 9/2017 | Tamaki | H04N 5/23212 |

FOREIGN PATENT DOCUMENTS

| | | |
|---|---|---|
| CN | 102655569 A | 9/2012 |
| CN | 102883093 A | 1/2013 |
| JP | 2010-160313 A | 7/2010 |
| JP | 2012-098510 A | 5/2012 |
| JP | 2012-230172 A | 11/2012 |
| JP | 2013-037296 A | 2/2013 |
| JP | 2013-545391 A | 5/2013 |
| WO | 2010-061756 A1 | 6/2010 |
| WO | 2012-018102 A1 | 2/2012 |
| WO | 2012/018102 A1 | 2/2012 |

OTHER PUBLICATIONS

Office Action for CN Patent Application No. 201480026086.3, dated Feb. 2, 2018, 14 pages of Office Action and 16 pages of English Translation.

* cited by examiner

FIG. 5
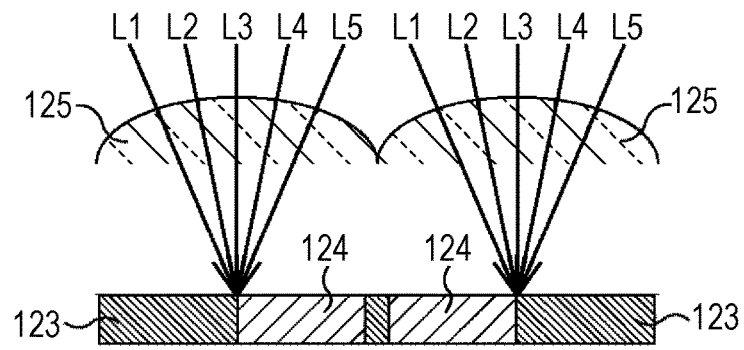
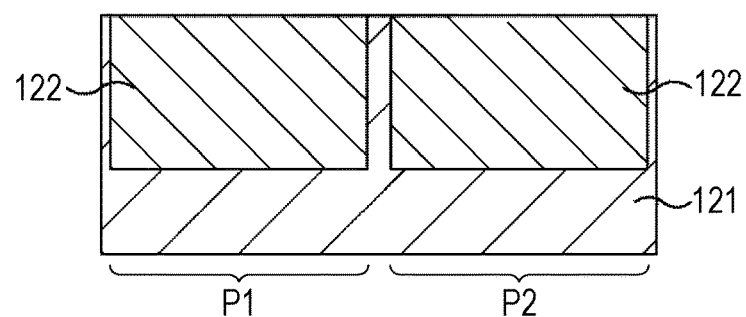
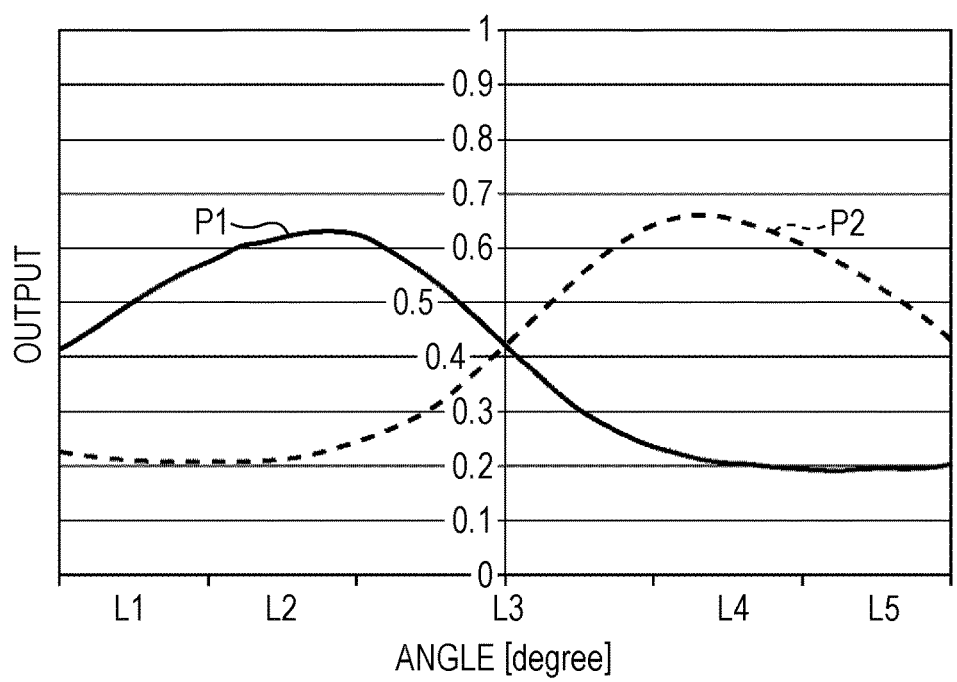

FIG. 7
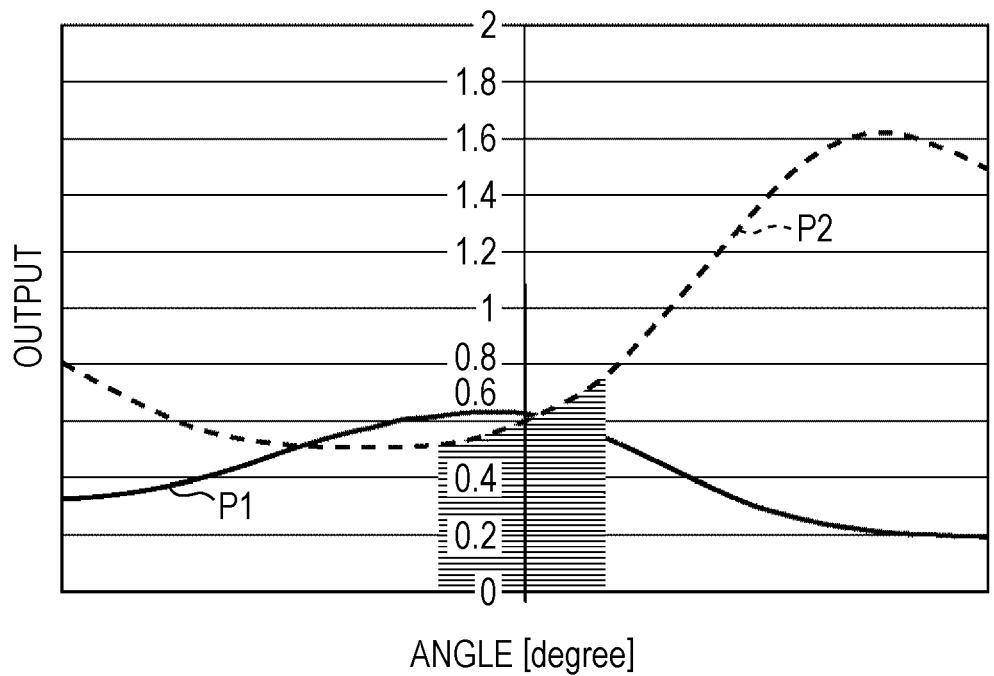
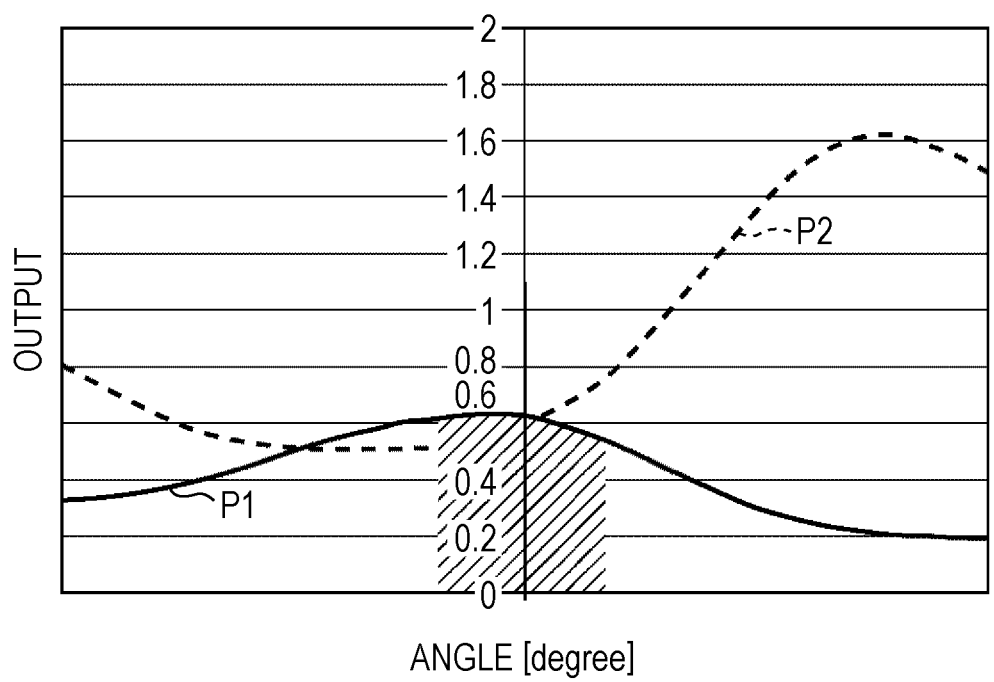

FIG. 12
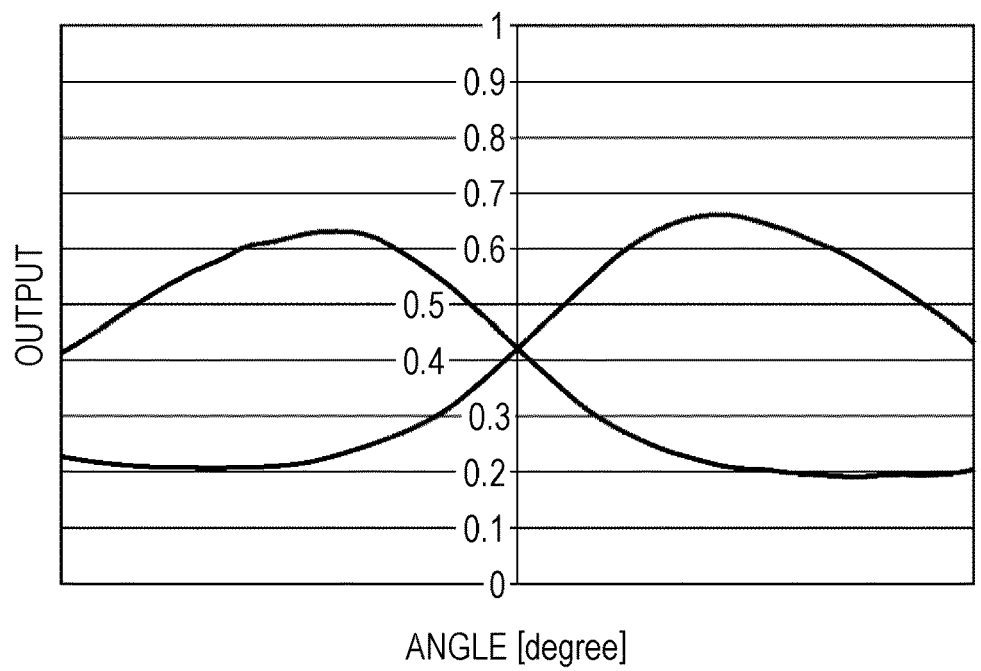
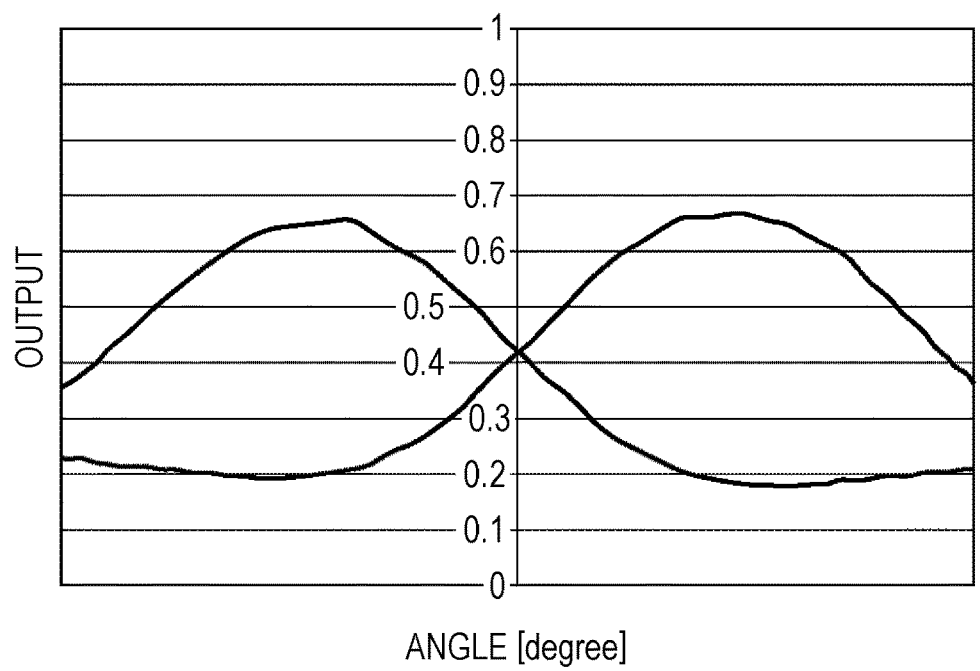

FIG. 20
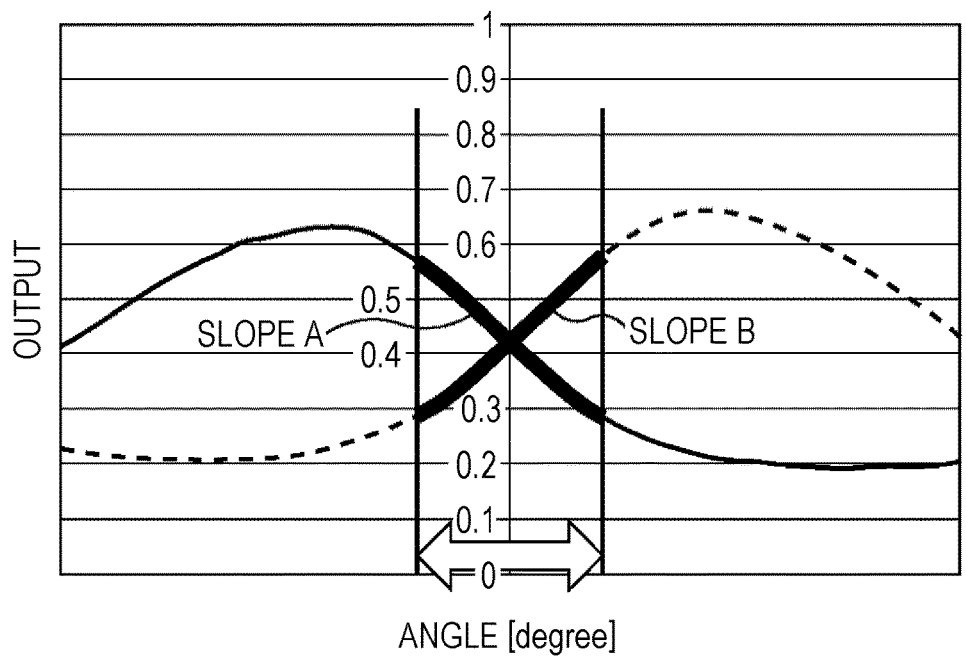
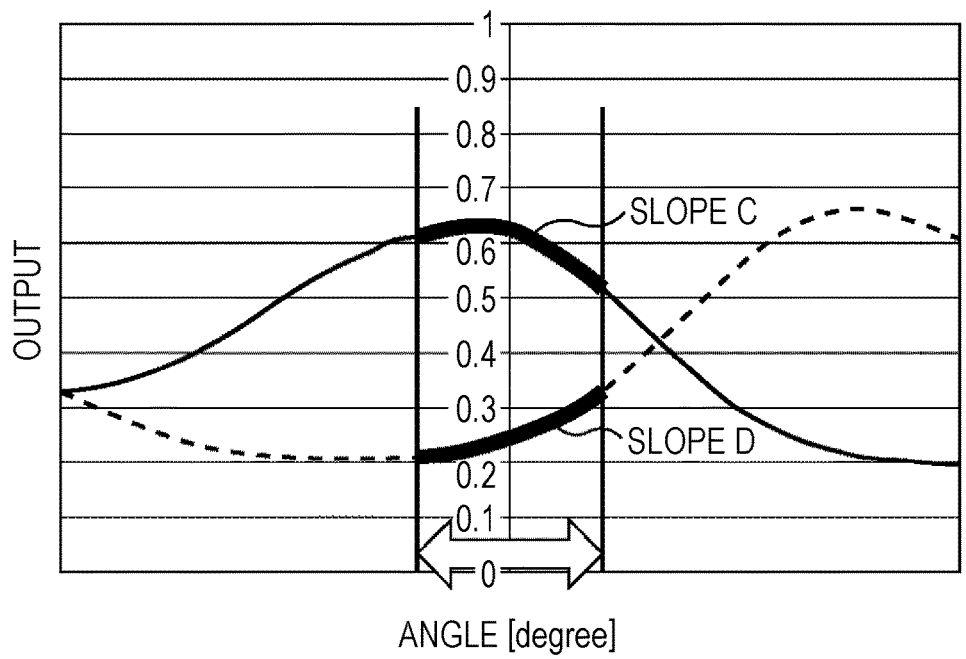

SOLID-STATE IMAGING DEVICE, ELECTRONIC APPARATUS, LENS CONTROL METHOD, AND IMAGING MODULE

TECHNICAL FIELD

The present technology relates to a solid-state imaging device, an electronic apparatus, a lens control method, and an imaging module which prevents the accuracy of auto focus (AF) from being reduced.

CROSS REFERENCE TO RELATED APPLICATIONS

This application claims the benefit of Japanese Priority Patent Application JP 2013-117688 filed Jun. 4, 2013, the entire contents of which are incorporated herein by reference.

BACKGROUND ART

In recent years, an imaging apparatus, which performs phase difference detection by providing phase difference detection pixels in which light is blocked from reaching a part of the photoelectric conversion section in the imaging device so as to perform auto focus (AF), has been developed (for example, refer to PTL 1).

CITATION LIST

Patent Literature

[PTL 1]
Japanese Unexamined Patent Application Publication No. 2010-160313

SUMMARY OF INVENTION

Technical Problem

Manufacturing variations, such as a misalignment in lithography at the time of forming a light blocking film and an on-chip lens of each pixel, or a misalignment in the imaging lens at the time of modularizing the imaging device, contribute to the reduction in an accuracy of phase difference detection. Accordingly, the reduction in phase difference detection may impact the accuracy of auto focus (AF).

According to the present technology, it is desirable to at least maintain the accuracy of AF even when a manufacturing variation exits.

Solution to Problem

According to an embodiment of the present technology, there is provided a solid-state imaging device including: a plurality of pixels that includes phase difference detection pixels for performing auto focus (AF) through phase difference detection. Each phase difference detection pixel includes an on-chip lens and a photoelectric conversion section that is formed on a lower layer than the on-chip lens. In a plurality of predetermined phase difference detection pixels among the phase difference detection pixels, the on-chip lenses are formed to have amounts of deviation different from amounts of exit pupil corresponding to arrangement of the predetermined phase difference detection pixels.

The phase difference detection pixel may further include a light blocking film which blocks light from reaching a part of the photoelectric conversion section. In the predetermined phase difference detection pixels, the on-chip lenses and the light blocking film may be formed to have amounts of deviation different from the amounts of exit pupil correction corresponding to the arrangement of the predetermined phase difference detection pixels.

The predetermined phase difference detection pixels may be arranged to be close to each other. In the predetermined phase difference detection pixels, the on-chip lenses and the light blocking film may be subjected to exit pupil correction based on amounts of correction different from the amount of exit pupil correction corresponding to the arrangement of the phase difference detection pixels.

The predetermined phase difference detection pixels may be arranged to be far from each other. In the predetermined phase difference detection pixels, the on-chip lenses and the light blocking film may not be subjected to exit pupil correction based on amounts of correction.

The predetermined phase difference detection pixels may be disposed outside an image output region where imaging pixels which are included in the plurality of pixels and are for generating an image are disposed.

The predetermined phase difference detection pixels may be disposed inside an image output region where imaging pixels which are included in the plurality of pixels and are for generating an image are disposed.

The pixels adjacent to the predetermined phase difference detection pixels may have on-chip lenses that are larger than normal size on-chip lenses.

The pixels adjacent to the predetermined phase difference detection pixels may have on-chip lenses that are smaller than normal size on-chip lenses.

The phase difference detection pixels may have photoelectric conversion sections which are separately formed as the photoelectric conversion section.

The solid-state imaging device may further include: a phase difference detection section that performs phase difference detection by using differences between outputs of the phase difference detection pixels; and a phase difference correction section that corrects detected phase differences by using the outputs of the predetermined phase difference detection pixels which are obtained in advance.

The phase difference correction section may correct the detected phase differences, on the basis of phase difference characteristics obtained by using the outputs of the predetermined phase difference detection pixels which are obtained in advance.

In a pair of the phase difference detection pixels, the phase difference characteristics may indicate respective outputs of the phase difference detection pixels at an angle of an optical axis of incident light. The phase difference correction section may correct the detected phase difference by using a correction parameter which is obtained using slopes of the outputs in a predetermined angular range of the phase difference characteristics.

The phase difference correction section may correct the detected phase difference by using the correction parameter corresponding to an F number of the lens.

The phase difference correction section may correct the detected phase difference by using the correction parameter corresponding to an image height.

The phase difference correction section may correct the detected phase difference by using the correction parameter corresponding to a photography environment.

According to another embodiment of the present technology, there is provided an electronic apparatus including: an imaging device that has a plurality of pixels including phase difference detection pixels for performing auto focus (AF) through phase difference detection, where each phase difference detection pixel includes an on-chip lens, a photoelectric conversion section that is formed on a lower layer than the on-chip lens, and a light blocking film which blocks light from reaching a part of the photoelectric conversion section, and where in a plurality of predetermined phase difference detection pixels among the phase difference detection pixels, the on-chip lenses and the light blocking film are formed to have amounts of deviation different from amounts of exit pupil correction corresponding to arrangement of the predetermined phase difference detection pixels; a lens that causes object light to be incident onto the imaging device; a phase difference detection section that performs phase difference detection by using differences between outputs of the phase difference detection pixels; a phase difference correction section that corrects detected phase differences by using outputs of the predetermined phase difference detection pixels which are obtained in advance; and a lens control section that controls driving of the lens in accordance with the corrected phase differences.

The electronic apparatus may further include a light source that emits light with a specific pattern. The phase difference correction section may correct the detected phase difference by using the correction parameter corresponding to a wavelength of the light source.

The phase difference detection pixels may be disposed inside an image output region where imaging pixels which are included in the plurality of pixels and are for generating an image are disposed. The electronic apparatus may further include a defect correction section that corrects outputs of the predetermined phase difference detection pixels by using the outputs of the predetermined phase difference detection pixels obtained in advance.

According to a further embodiment of the present technology, there is provided a lens control method for an electronic apparatus including: an imaging device that has a plurality of pixels including phase difference detection pixels for performing auto focus (AF) through phase difference detection, where each phase difference detection pixel includes an on-chip lens, a photoelectric conversion section that is formed on a lower layer than the on-chip lens, and a light blocking film which blocks light from reaching a part of the photoelectric conversion section, and where in a plurality of predetermined phase difference detection pixels among the phase difference detection pixels, the on-chip lenses and the light blocking film are formed to have amounts of deviation different from amounts of exit pupil correction corresponding to arrangement of the predetermined phase difference detection pixels; and a lens that causes object light to be incident onto the imaging device. The lens control method for the electronic apparatus includes: performing phase difference detection by using differences between outputs of the phase difference detection pixels; correcting detected phase differences by using outputs of the predetermined phase difference detection pixels which are obtained in advance; and controlling driving of the lens in accordance with the corrected phase differences.

According to a further embodiment of the present technology, there is provided an imaging module including: an imaging device that has a plurality of pixels including phase difference detection pixels for performing auto focus (AF) through phase difference detection, where each phase difference detection pixel includes an on-chip lens, a photoelectric conversion section that is formed on a lower layer than the on-chip lens, and a light blocking film which blocks light from reaching a part of the photoelectric conversion section, and where in a plurality of predetermined phase difference detection pixels among the phase difference detection pixels, the on-chip lenses and the light blocking film are formed to have amounts of deviation different from amounts of exit pupil correction corresponding to arrangement of the predetermined phase difference detection pixels; a lens that causes object light to be incident onto the imaging device; and an optical filter that is formed between the imaging device and the lens. The lens and the optical filter are formed in accordance with phase difference characteristics obtained by using outputs of the predetermined phase difference detection pixels which are obtained in advance.

According to one embodiment of the present technology, in the plurality of predetermined phase difference detection pixels among the phase difference detection pixels, the on-chip lenses are formed to have amounts of deviation different from amounts of exit pupil correction corresponding to arrangement of the predetermined phase difference detection pixels.

According to a further embodiment of the present technology, there is provided a solid-state imaging device comprising a pixel region including a plurality of pixels arranged in a two-dimensional matrix pattern, wherein at least some of the plurality of pixels are phase difference detection pixels that include a photoelectric conversion section disposed on a semiconductor substrate and a light blocking film disposed above a portion of the photoelectric conversion section, and wherein a location of the light blocking film for a phase difference detection pixel positioned at a periphery of the pixel region is different than a location of the light blocking film for a phase difference detection pixel positioned in a center portion of the pixel region.

According to a further embodiment of the present technology, there is provided an electronic apparatus comprising a lens and a solid-state imaging device, where the solid state imaging device includes a pixel region having a plurality of pixels arranged in a two-dimensional matrix pattern, wherein at least some of the plurality of pixels are phase difference detection pixels that include a photoelectric conversion section disposed on a semiconductor substrate and a light blocking film disposed above a portion of the photoelectric conversion section, and wherein a location of the light blocking film for a phase difference detection pixel positioned at a periphery of the pixel region is different than a location of the light blocking film for a phase difference detection pixel positioned in a center portion of the pixel region.

In some instances, the center portion comprises a center portion located at a periphery of the pixel region; alternatively, or in addition, the center portion comprises a center portion located at a central portion of the pixel region.

Each of the phase difference detection pixels may include an on-chip lens disposed above the light blocking film, the phase difference detection pixels may be disposed in a non-imaging region of the pixel region, and groups of the phase difference detection pixels may be located in one or more non-imaging regions located at a side of the pixel region.

The on-chip lenses and the light blocking film for some of the phase difference detection pixels may not subjected to exit pupil correction; however, the on-chip lenses for some of the plurality of pixels other than the phase difference detection pixels are subjected to exit pupil correction.

The on-chip lenses and the light blocking film for the phase difference detection pixels may be subjected to exit pupil correction.

A light blocking film of a first phase difference detection pixel may be arranged to block light at a left side of the first phase different detection pixel and a light blocking film of a second phase difference detection pixel may be arranged to block light at a right side of the second phase difference detection pixel.

In particular, an amount of exit pupil correction corresponding to a lens of a pixel in a first location is different than an amount of exit pupil correction applied to a lens of a phase difference detection pixel in the first location.

In some instances, at least one phase difference detection pixel has a plurality of photoelectric conversion sections.

Advantageous Effects of Invention

According to one embodiment of the present technology, even when there is a manufacturing variation, it is possible to prevent the accuracy of AF from being lowered.

BRIEF DESCRIPTION OF DRAWINGS

FIG. 5 is a diagram illustrating phase difference characteristics of the phase difference detection pixels.
FIG. 7 is a diagram illustrating correction of phase difference detection in the related art.
FIG. 12 is a diagram illustrating actually measured data of phase difference characteristics of monitoring pixels.
FIG. 20 is a diagram illustrating calculation of a correction parameter.

DESCRIPTION OF EMBODIMENTS

Hereinafter, an embodiment of the present technology will be described with reference to the accompanying drawings. Description will be given in the following order:
1. Imaging Devices in Related Art and Problems Thereof;
2. Regarding Imaging Device of Present Technology; and
3. Regarding Electronic Apparatus Equipped with Imaging Device of Present Technology.
<1. Problem of Imaging Device in Related Art>
<Imaging Device on which Exit Pupil Correction is not Performed>

Figure 1:
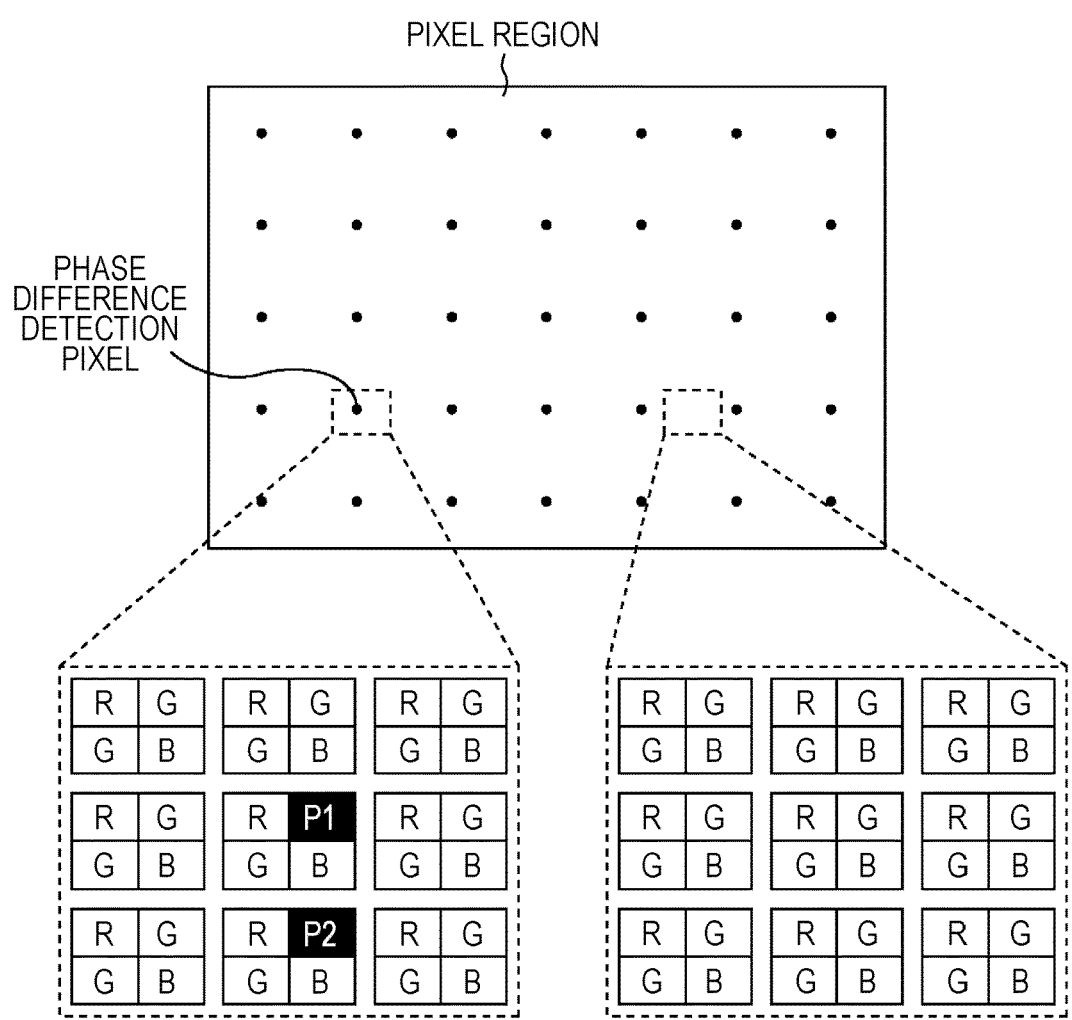
FIG. 1 is a diagram illustrating pixel arrangement of an imaging device.

FIG. 1 illustrates a pixel arrangement of a general imaging device capable of performing phase difference detection.

As shown in FIG. 1, in the imaging device, a plurality of imaging pixels as indicated by the white squares are arranged in a two-dimensional matrix. The imaging pixels are formed of R pixels, G pixels, and B pixels, and the pixels are regularly arranged in the Bayer pattern. That is, a regular arrangement of the pixels includes arranging the pixels in a Bayer pattern.

Further, in the plurality of imaging pixels that are arranged in a two-dimensionally arranged matrix, a plurality of phase difference detection pixels, as indicated by the black squares, are distributed within such an arrangement. The phase difference detection pixels are regularly arranged in a predetermined pattern by replacing some of the imaging pixels in the imaging device at specific locations. As illustrated in FIG. 1, two G pixels are replaced by the phase difference detection pixels P1 and P2.

Figure 2:
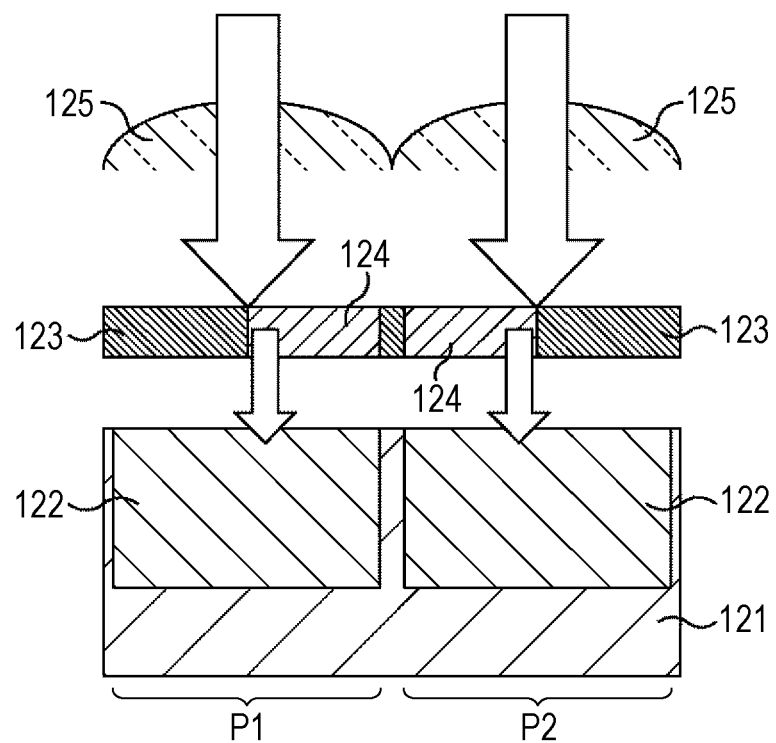
FIG. 2 is a cross-sectional view illustrating a structural example of phase difference detection pixels.

FIG. 2 illustrates a cross-sectional view of the phase difference detection pixels of FIG. 1. In FIG. 2, the phase difference detection pixels, P1 and P2, are disposed adjacent to each other; however, as additionally shown in FIG. 1, a predetermined number of imaging pixels are interposed between the phase difference detection pixels.

As illustrated in the phase difference detection pixels P1 and P2 of FIG. 2, photodiodes 122, or photoelectric conversion sections, are formed on a semiconductor substrate (Si substrate) 121. Above the semiconductor substrate 121, a light blocking film 123 and color filters 124 are formed in the same layer, and on-chip lenses 125 are formed on a layer above the light blocking film 123 and color filters 124.

As illustrated in FIG. 2, the phase difference detection pixels, P1 and P2, are configured such that light is blocked on the left side of the pixel P1 and light is blocked on the right side of the pixel P2. Additionally, in accordance with each pixel arrangement, light may be blocked on the upper side thereof and the lower side thereof. Alternatively, or in addition, obliquely incident light may be blocked.

In accordance with at least some embodiments of the present technology, exit pupil correction is correction wherein the positions of the on-chip lens and/or color filter (e.g. the positions of elements configured to perform photoelectric conversion such as a photodiode and so forth) are changed or modified for each pixel location assuming the entry angle of light to be input to the photoelectric conversion area. Stated another way, exit pupil correction makes an optical center of the on-chip lens deviate from a center of the photodiode 122; that is, the optical center of the on-chip lens and the center of the photodiode 122 are eccentric. In the periphery of the imaging device, this deviation may be greater or smaller than in the central portion of the imaging device. In each of the phase difference detection pixels P1 and P2 of FIG. 2, so-called exit pupil correction is not performed.

<Imaging Device Performing Exit Pupil Correction>

Figure 3:
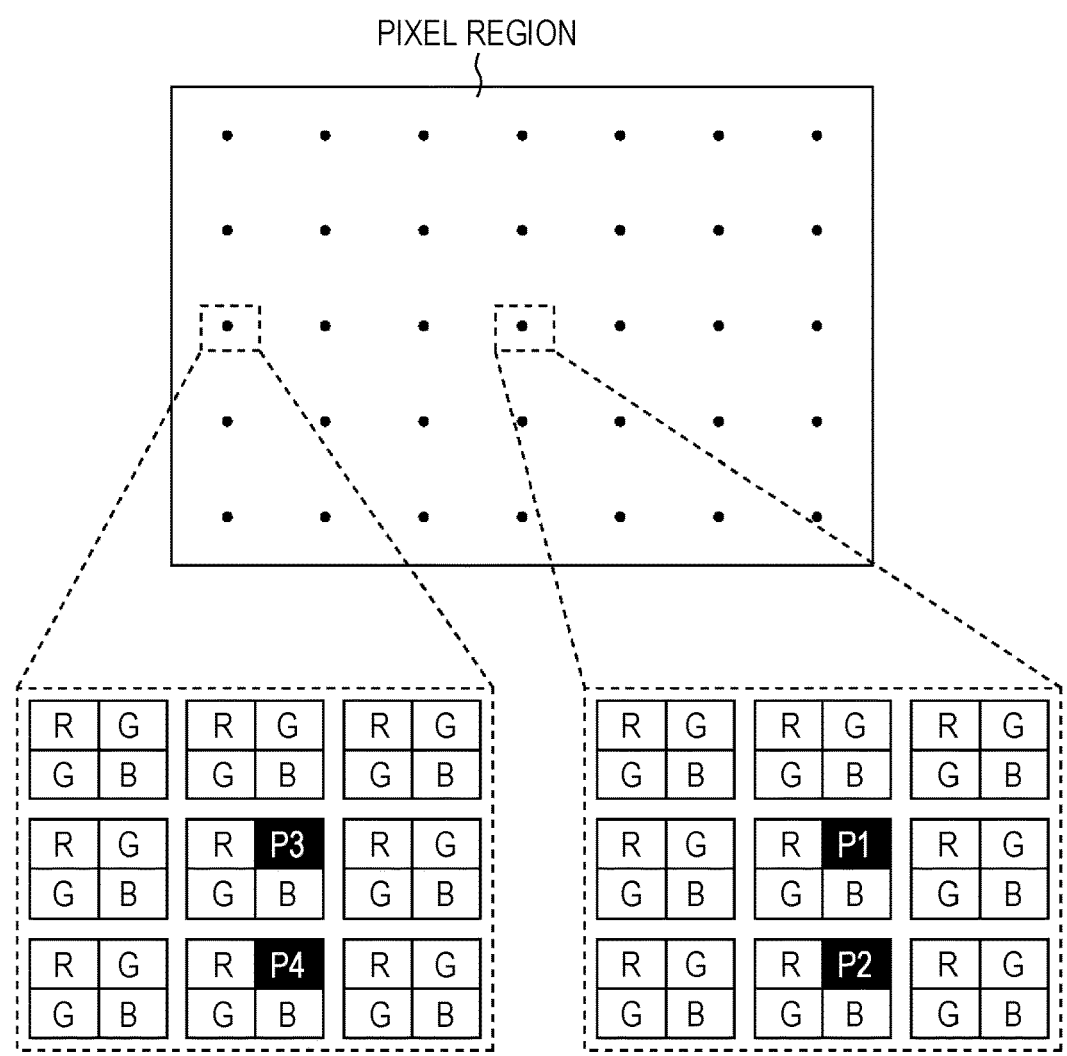
FIG. 3 is a diagram illustrating pixel arrangement of the imaging device.

FIG. 3 shows another example of a pixel arrangement in the general imaging device capable of performing phase difference detection.

As in FIG. 1, in the imaging device of FIG. 3, within the plurality of imaging pixels arranged in a two-dimensional matrix, the plurality of phase difference detection pixels as indicated by the black squares are arranged according to a predetermined distribution. In the example of FIG. 3, the two G pixels, which are substantially at the center of the pixel region, are replaced by the phase difference detection pixels P1 and P2. Additionally, the two G pixels, which are at the periphery of the pixel region (the left side in the drawing), are replaced by phase difference detection pixels P3 and P4.

Figure 4:
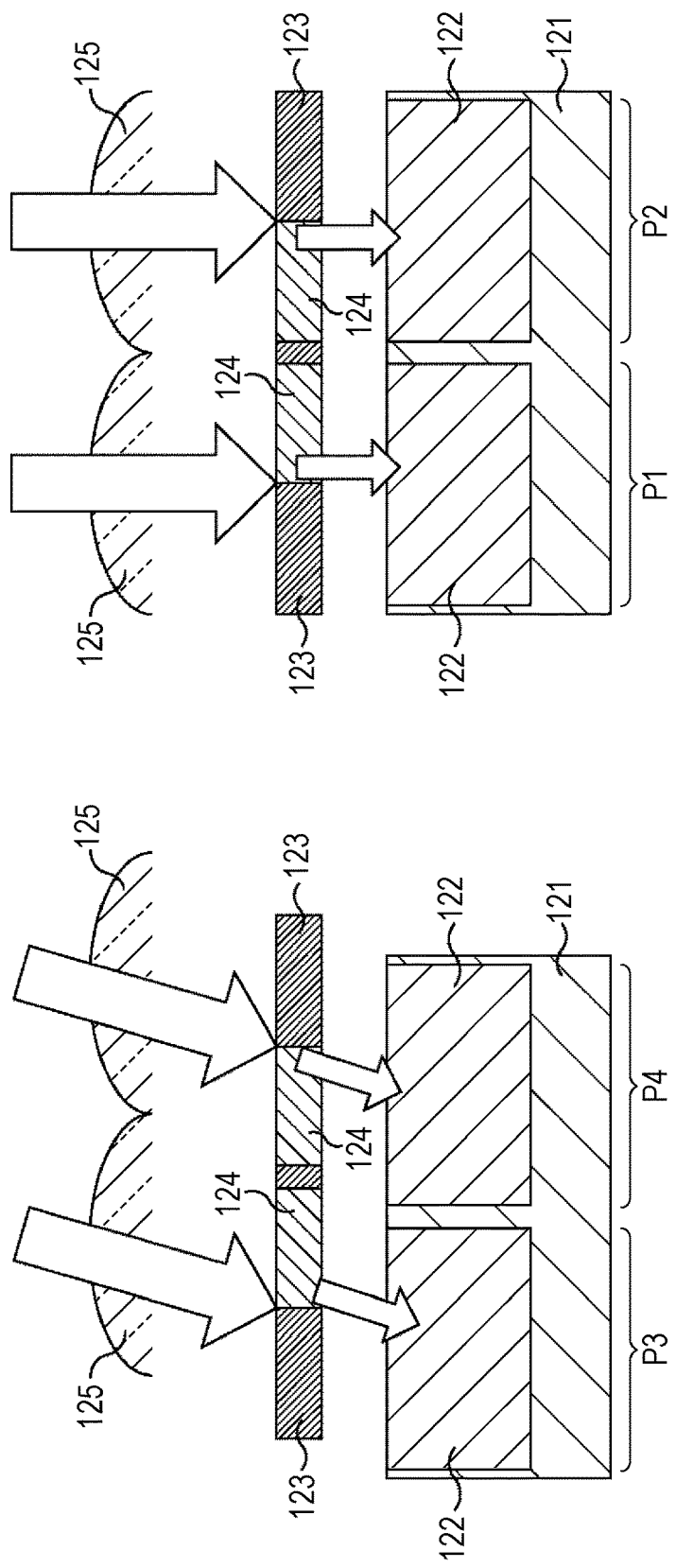
FIG. 4 is a cross-sectional view illustrating structural examples of phase difference detection pixels.

FIG. 4 illustrates a cross-sectional view of the phase difference detection pixels of FIG. 3.

As described above, since the phase difference detection pixels P1 and P2 are located substantially at the center of the pixel region, at this position, the angle of incidence for principal rays of light coming from the imaging lens (not shown in the drawing), is 0 degrees. Therefore, in the phase difference detection pixels P1 and P2, exit pupil correction is not performed.

In contrast, since the phase difference detection pixels P3 and P4 are located at the periphery of the pixel region, at this position, the angle of incidence for principal rays of light coming from the imaging lens, is at a predetermined angle in accordance with the lens design. Therefore, in the phase difference detection pixels P3 and P4, exit pupil correction is performed in accordance with the angle of incidence.

With reference to FIG. 5, a description is provided relating to the pixel output when the angle of incidence pertaining to the light incident on the phase difference detection pixels P1 and P2 is changed and exit pupil correction is not performed.

As shown in the upper portion of FIG. 5, light beams L1 to L5 from five directions are incident onto the phase difference detection pixels P1 and P2. The graph on the lower portion of FIG. 5 illustrates the pixel output of the phase difference detection pixels P1 and P2 at this time.

In the graph on the lower portion of FIG. 5, the horizontal axis indicates the angle of incidence of the light beams L1 to L5, and the vertical axis indicates the pixel output of the phase difference detection pixels P1 and P2. In addition, the solid line indicates the pixel output of the phase difference detection pixel P1, and the dashed line indicates the pixel output of the phase difference detection pixel P2.

As shown in the graph, the output of the phase difference detection pixel P1, in which light is blocked on the left side, is large when the angle of the incident light is on the left side (negative side), and the output of the phase difference detection pixel P2, in which light is blocked on the right side, is large when the angle of the incident light is on the right side (positive side). That is, as in the incident light L1, when an angular component of the incident light in the negative direction is large, the output of the phase difference detection pixel P1 is larger than the output of the phase difference detection pixel P2. Further, as in the incident light L5, when an angular component of the incident light in the positive direction is large, the output of the phase difference detection pixel P2 is larger than the output of the phase difference detection pixel P1.

Such pixel output of respective phase difference detection pixels relative to the angle of incidence of the incident light in the pair of phase difference detection pixels are hereinafter referred to as phase difference characteristics.

Figure 6:
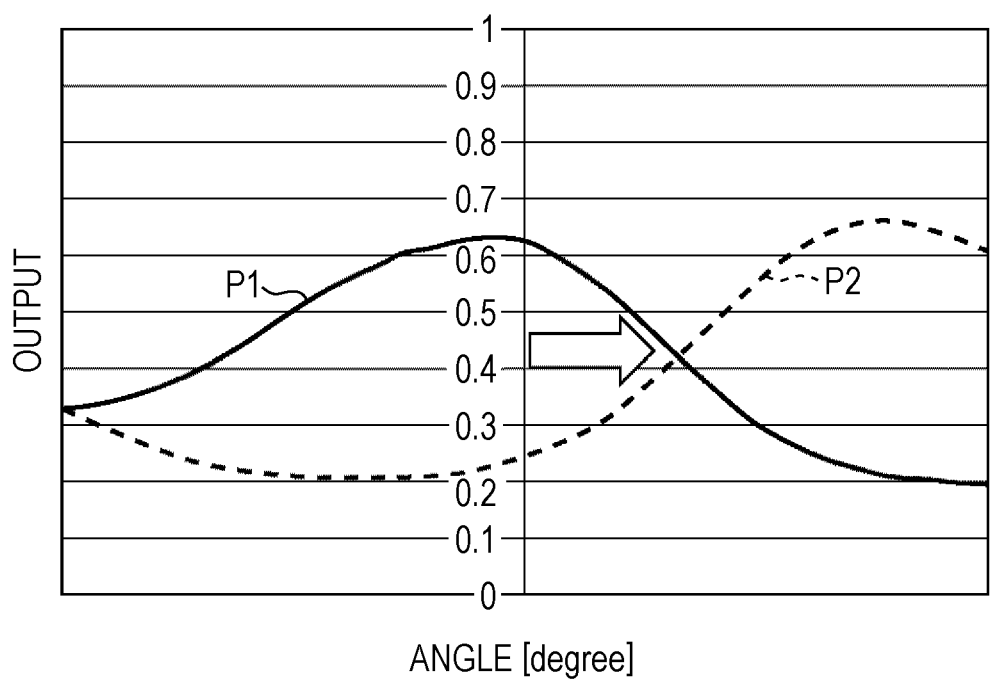
FIG. 6 is a diagram illustrating phase difference characteristics of the phase difference detection pixels.

However, due to a misalignment in lithography at the time of forming the light blocking film and the on-chip lens of each pixel, or a misalignment in the imaging lens at the time of modularizing the imaging device in the semiconductor process, phase difference characteristics of the phase difference detection pixels P1 and P2 may exhibit characteristics as shown in FIG. 6.

In the phase difference characteristics shown in FIG. 6, compared with FIG. 5, the intersection point between the output of the phase difference detection pixel P1 and the output of the phase difference detection pixel P2 is shifted to an angle in the positive direction. That is, due to the above-mentioned manufacturing variations, sensitivity deviation occurs even between the phase difference detection pixels P1 and P2 which are substantially at the center of the pixel region.

In contrast, a method of performing correction by applying a gain to the difference between the pixel outputs based on the manufacturing variations is disclosed in, for example, Japanese Unexamined Patent Application Publication No. 2010-49209. Specifically, by applying a gain to the differences that are obtained from the phase difference characteristics shown in FIG. 6, that is, the differences between the integral values of the outputs of the phase difference detection pixels P1 and P2 within a predetermined angular range in which the angle incidence of 0 is at the center such that the differences between the integral values are the same, the characteristics shown in FIG. 7 may be obtained. Here, the predetermined angular range is determined by the F number of the imaging lens and the like, and indicates a range of the angle of incidence of the incident light. Further, when the output of the phase difference detection pixels in the angular range are integrated, the integration can be performed by weighting the output for each angle.

In the characteristics shown in the upper portion of FIG. 7, the integral value of the output of the phase difference detection pixel P2 in the predetermined angular range is indicated by hatching. In the characteristics shown in the lower portion of FIG. 7, the integral value of the output of the phase difference detection pixel P1 in the predetermined angular range is indicated by hatching. According to the method, the integral values shown in FIG. 7 are equal, but the shapes of the curves, which respectively indicate the outputs of the phase difference detection pixels P1 and P2, are completely different from the shapes shown in FIG. 5.

In the AF technique of calculating an amount of focal deviation based on the phase difference detection, an intersection point of the phase difference detection characteristics and the separation state of the curves which respectively indicate the outputs of the pixel in which light is blocked on the left side and the pixel in which light is blocked on the right side is important.

For example, in a defocused state, when the angular component of the incident light in the positive direction becomes large, the difference between the output of the pixel in which light is blocked on the left side and the output of the pixel in which light is blocked on the right side changes depending on the separation state and the slopes of the curves indicating the respective outputs. That is, like the method disclosed in Japanese Unexamined Patent Application Publication No. 2010-49209, by correcting the difference between the outputs, as shown in FIG. 8, the amount of focal deviation relative to phase difference may occur at a predetermined ratio.

Figure 8:
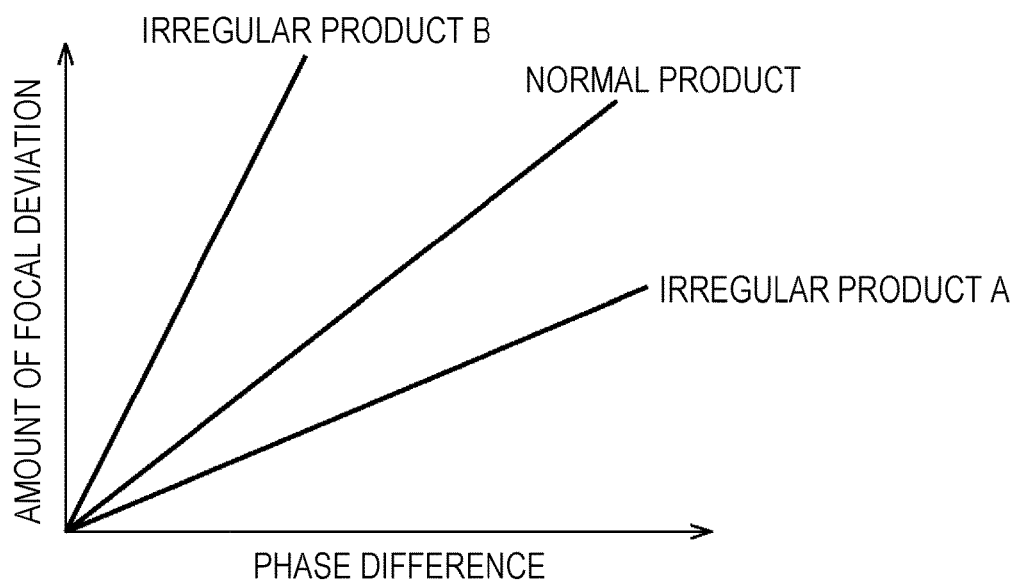
FIG. 8 is a diagram illustrating an amount of focal deviation relative to a phase difference.

In FIG. 8, compared with a normal product, the irregular product A has a small amount of focal deviation relative to phase difference. In contrast, compared with a normal product, the irregular product B has a large amount of focal deviation relative to phase difference. That is, in the irregular product A and the irregular product B, even when a phase difference is detected, a shift in the amount of focus can be predicted in order to achieve appropriate focus. Hence, in AF control based on phase difference detection, it is necessary to perform the AF control in combination with a contrast method as described the related art.

Further, the above-mentioned phase difference characteristics are obtained by changing the angle of incidence of the incident light in the same phase difference detection pixels P1 and P2. Hence, in a state where the imaging lens is mounted, the angle of incidence of the light coming from the imaging lens is fixed, and thus it is difficult to obtain the phase difference characteristics.

Accordingly, hereinafter, a description will be provided relating to an imaging device capable of obtaining the phase difference characteristics of the phase difference detection pixels even where the imaging lens is mounted; additionally, the description will also be applicable to an imaging device capable of correcting the phase difference characteristics even where manufacturing variations may exist.

<2. Regarding Imaging Device of Present Technology>
<Configuration Example of Imaging Device>

Figure 9:
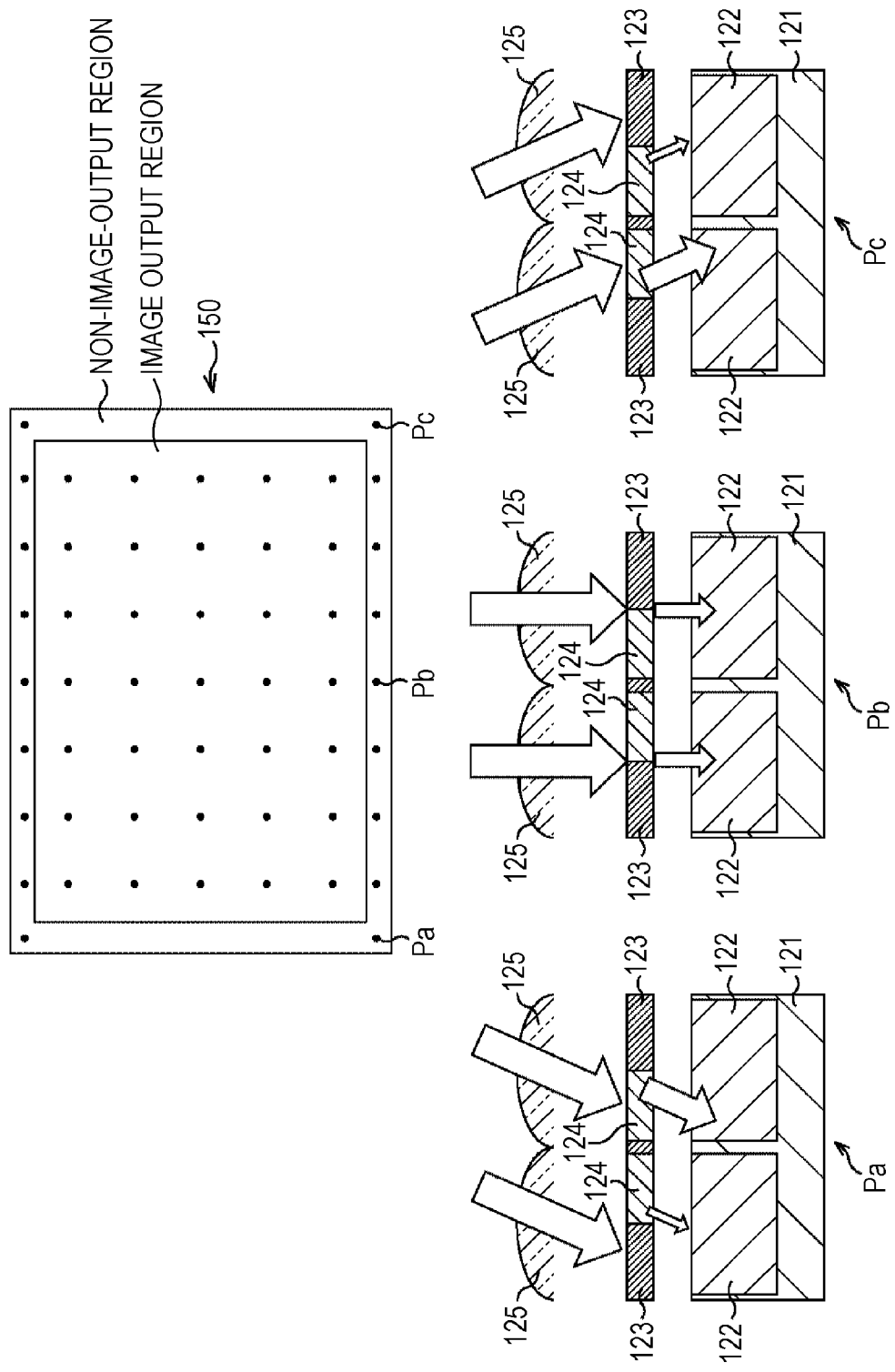
FIG. 9 is a diagram illustrating a configuration example of the imaging device according to the present technology.

FIG. 9 illustrates an example of an imaging device according to the present technology.

In the upper portion of FIG. 9, an example pixel arrangement of the imaging device 150 is shown.

In the imaging device 150, a pixel (imaging pixel), which generates a signal for generating an image on the basis of light received from an object, and a pixel (phase difference detection pixel), which generates a signal utilized to perform AF based on the detection of the phase difference, are arranged as shown.

Specifically, in the imaging device 150, a plurality of imaging pixels are arranged in a two-dimensional matrix. Each imaging pixel is formed of an R pixel, a G pixel, and a B pixel, regularly arranged in the Bayer pattern.

In the imaging device 150, within the plurality of imaging pixels arranged in a two-dimensional matrix, the plurality of phase difference detection pixels are arranged according to a predetermine distribution. That is, the phase difference detection pixels are regularly arranged in a specific pattern by replacing specific imaging pixels in the imaging device 150.

In addition, the phase difference detection pixels may be irregularly arranged in the imaging device 150. When the phase difference detection pixels are regularly arranged, it is possible to easily perform signal processing such as defect correction, as will be described later. When the phase difference detection pixels are irregularly arranged, an artifact based on the defect correction also becomes irregular, and thus deterioration in the visibility thereof may occur (the phase difference detection pixels may be made to be less noticeable).

The region in which the pixels are arranged in the imaging device 150 is divided into an image output region and a non-image-output region. The output of the pixels arranged in the image output region are used in generating an image, while the output of the pixels arranged in the non-image-output region are not used in generating an image.

As shown in the upper portion of FIG. 9, in the non-image-output regions in the sides above and below the image output region in the imaging device 150, the pairs of phase difference detection pixels are arranged in the horizontal direction of the drawing. Here, the phase difference detection pixels arranged in the non-image-output region are hereinafter appropriately referred to as monitoring pixels.

The lower portion of FIG. 9 illustrates a cross-sectional view of pairs of monitoring pixels Pa, Pb, and Pc (hereinafter simply referred to as monitoring pixels Pa, Pb, and Pc) arranged in the non-image-output region on a side below the image output region.

As shown in the lower portion of FIG. 9, in the monitoring pixels Pa, Pb, and Pc, the photodiodes 122 as photoelectric conversion sections are formed on the semiconductor substrate (Si substrate) 121. Above the semiconductor substrate 121, the light blocking film 123 and the color filters 124 are formed in the same layer, and the on-chip lenses 125 are formed in the layer above the light blocking film 123 and the color filters 124.

In the monitoring pixels Pa, Pb, and Pc, the light blocking film 123, the color filters 124, and the on-chip lenses 125 are formed to have an amount of deviation different from the amounts of exit pupil correction corresponding to the respective positions of the monitoring pixels Pa, Pb, and Pc. That is, the optical center of the on-chip lens and the center of the photodiode 122 deviate from one another; this deviation is different than an amount of deviation expected for exit pupil correction corresponding to the respective locations of the monitoring pixels Pa, Pb, and Pc. Specifically, in the monitoring pixels Pa, Pb, and Pc, the light blocking film 123, the color filters 124, and the on-chip lenses 125 are not configured in accordance with and/or subjected to exit pupil correction.

Here, when the imaging lens is mounted on the imaging device 150, the incident light beams having different angles of incidences are incident on the monitoring pixels Pa, Pb, and Pc. That is, as the output of the monitoring pixels Pa, Pb, and Pc, an output, which is the same as the pixel output when the angles of incidences of the incident light beams on the phase difference detection pixels on which exit pupil correction is not performed as described with reference to FIG. 5, is obtained.

Consequently, according to the imaging device 150, even when the imaging lens is mounted on the imaging device 150, it is possible to obtain the phase difference characteristics as shown in the lower portion of FIG. 5.

As in the imaging device 150, by arranging the phase difference detection pixels in which exit pupil correction is not performed in the horizontal direction (right-left direction), it is possible to obtain the phase difference characteristics corresponding to the incident angle of the light which is incident from the imaging lens. However, in the case of the imaging lens in which the incident light beams are substantially parallel (for example, the angle of incidence is less than 5 degrees) at the full angle of view (the whole surface of the sensor of the imaging device), it is possible to obtain the phase difference characteristics within an angular range of +/−5 degrees. Accordingly, referring to FIG. 10, the configuration of an imaging device for solving this problem will be described.

<Another Configuration Example of Imaging Device>

Figure 10:
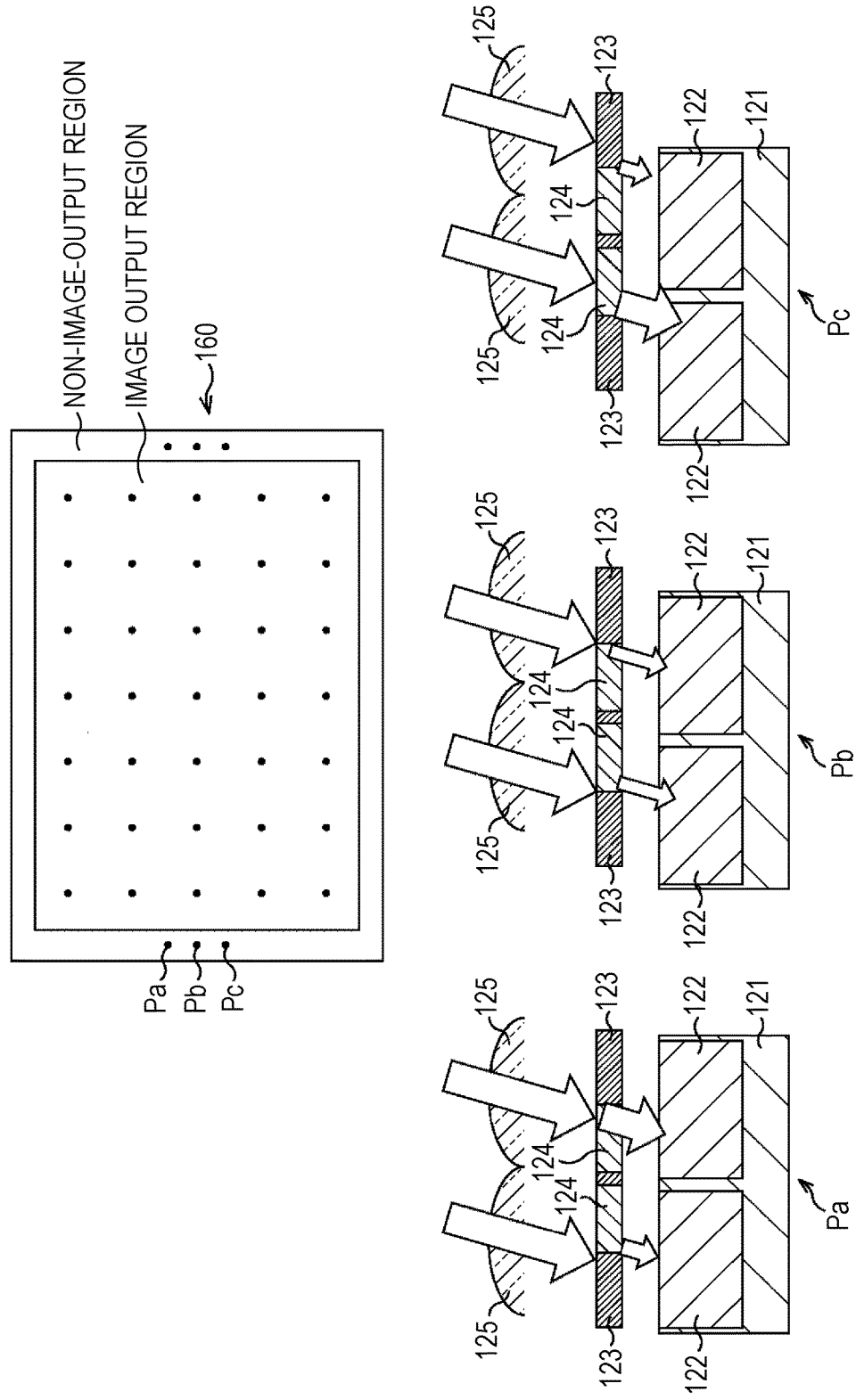
FIG. 10 is a diagram illustrating another configuration example of the imaging device according to the present technology.

FIG. 10 shows another example of the imaging device according to the present technology.

In the upper portion of FIG. 10, an example of pixel arrangement of an imaging device 160 is shown.

The pixel arrangement of the imaging device 160 in the upper portion of FIG. 10 is different from the pixel arrangement of the imaging device 150 in the upper portion of FIG. 9 in that the monitoring pixels are not provided in the non-image-output regions on the sides above and below the image output region. Rather, the monitoring pixels are provided in the non-image-output regions on the sides to the right and left of the image output region.

The lower portion of FIG. 10 illustrates a cross-sectional view of monitoring pixels Pa, Pb, and Pc arranged near one another in the non-image-output region on the side to the left of the image output region.

Each configuration of the monitoring pixels Pa, Pb, and Pc shown in the lower portion of FIG. 10 is similar to the lower portion of FIG. 9, and thus the detailed description will be omitted.

Likewise, in the monitoring pixels Pa, Pb, and Pc shown in the lower portion of FIG. 10, the light blocking film 123, the color filters 124, and the on-chip lenses 125 are formed to have an amount of deviation different from the amounts of exit pupil correction corresponding to the respective positions of the monitoring pixels Pa, Pb, and Pc. That is, the optical center of the on-chip lenses 125, the color filters 124, and the center of the photodiode 122 deviate from one another; this deviation is different than an amount of deviation expected for exit pupil correction corresponding to the respective locations of the monitoring pixels Pa, Pb, and Pc. For example, the optical center of the on-chip lenses 125, the color filters 124, and the center of the photodiode 122 are eccentric; that is, may not share the same center. Specifically, in the monitoring pixels Pa, Pb, and Pc, the light blocking film 123, the color filters 124, and the on-chip lenses 125 are subjected to exit pupil correction based on an amount of correction that is different from an amount of exit pupil correction corresponding to the respective arrangement of the monitoring pixels Pa, Pb, and Pc.

More specifically, the monitoring pixel Pb is subjected to exit pupil correction based on an amount of exit pupil correction corresponding to an arrangement of the monitoring pixels. The monitoring pixel Pa is subjected to exit pupil correction based on an amount of correction smaller than the amount of exit pupil correction corresponding to the arrangement. The monitoring pixel Pc is subjected to exit pupil correction based on an amount of correction larger than the amount of exit pupil correction corresponding to the arrangement.

Here, when the imaging lens is mounted on the imaging device 160, the incident light beams with substantially the same angles of incidence are respectively incident on the monitoring pixels Pa, Pb, and Pc, but are subjected to different amounts of exit pupil correction; that is, the amount of exit pupil correction applied to Pa, Pb, and Pc are different from each other. Therefore, as output of the monitoring pixels Pa, Pb, and Pc, the pixel output of the angles of incidence of the incident light beams onto the phase difference detection pixels are obtained.

Figure 11:
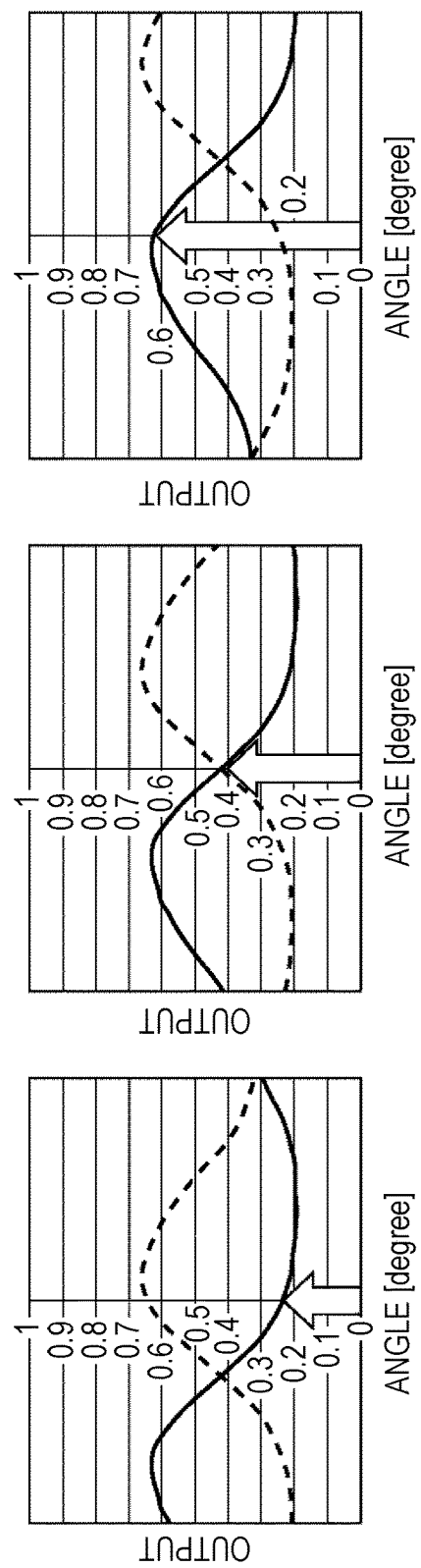
FIG. 11 is a diagram illustrating phase difference characteristics of monitoring pixels.

FIG. 11 shows respective sets of phase difference characteristics of the monitoring pixels Pa, Pb, and Pc of FIG. 10. On the left side of FIG. 11, the phase difference characteristics of the monitoring pixel Pa are shown. At the center of FIG. 11, the phase difference characteristics of the monitoring pixel Pb are shown. On the right side of FIG. 11, the phase difference characteristics of the monitoring pixel Pc are shown.

From the monitoring pixels Pa, Pb, and Pc of FIG. 10, it is possible to obtain, as the pixel output, only the output at predetermined angles (for example 30 degrees and the like) which are indicated by the outlined arrows in the respective sets of phase difference characteristics shown in FIG. 11 and which are determined depending on the angle of incidence of which the imaging lens has been designed. Thus, by sampling the output of the phase difference detection pixels that are subjected to the exit pupil correction based on the amount of correction different from each other, the phase difference characteristics curves of the pixel output can be obtained.

Consequently, according to the imaging device 160, even when the imaging lens is mounted on the imaging device 160, the phase difference characteristics as shown in the lower portion of FIG. 5 may be obtained.

FIG. 12 depicts actual measured data of the phase difference characteristics of the above-mentioned monitoring pixels.

In the upper portion of FIG. 12, as described with reference to FIG. 9, the phase difference characteristics are shown which are obtained when the incident light beams with angle of incidences different from each other are incident onto the phase difference detection pixels (monitoring pixels) on which exit pupil correction is not performed. Further, on the lower portion of FIG. 12, as described with reference to FIG. 10, the phase difference characteristics are shown which are obtained when the incident light beams with the fixed angles of incidences are incident onto the phase difference detection pixels (monitoring pixels) on which exit pupil correction based on the amounts of correction different from each other is performed.

As shown in FIG. 12, the curves of the respective sets of phase difference characteristics have substantially the same shape. That is, a predetermined number of monitoring pixels are formed to have amounts of deviation different from the amounts of exit pupil correction corresponding to the respective types of arrangement. Accordingly, the pixel outputs are sampled to obtain the phase difference characteristics. Thereby, it is possible to sort non-defective products/defective products in the imaging device.

<Shape of on-Chip Lens>

As described above, in the imaging device 160 shown in FIG. 10, the monitoring pixels are subjected to exit pupil correction based on the amounts of correction different from the amounts of exit pupil correction corresponding to the respective types of arrangement. Hence, in the imaging device 160, as shown in the left side of FIG. 13, there may be interspace between on-chip lenses, between the monitoring pixels which are disposed in a region (exit-pupil-correction-amount shift region) in which the amounts of exit pupil correction are shifted, and the pixels which are adjacent to the monitoring pixels and are subjected to exit pupil correction based on appropriate amounts of correction. In such an instance, there may be a collapse in the shapes of the lenses.

As described above, there is a concern that the existence of interspace between the on-chip lenses and the collapse in the lens shapes may cause color mixture between the monitoring pixels and the adjacent pixels; accordingly, the phase difference characteristics, which are obtained from the monitoring pixels, may deteriorate.

Figure 13:
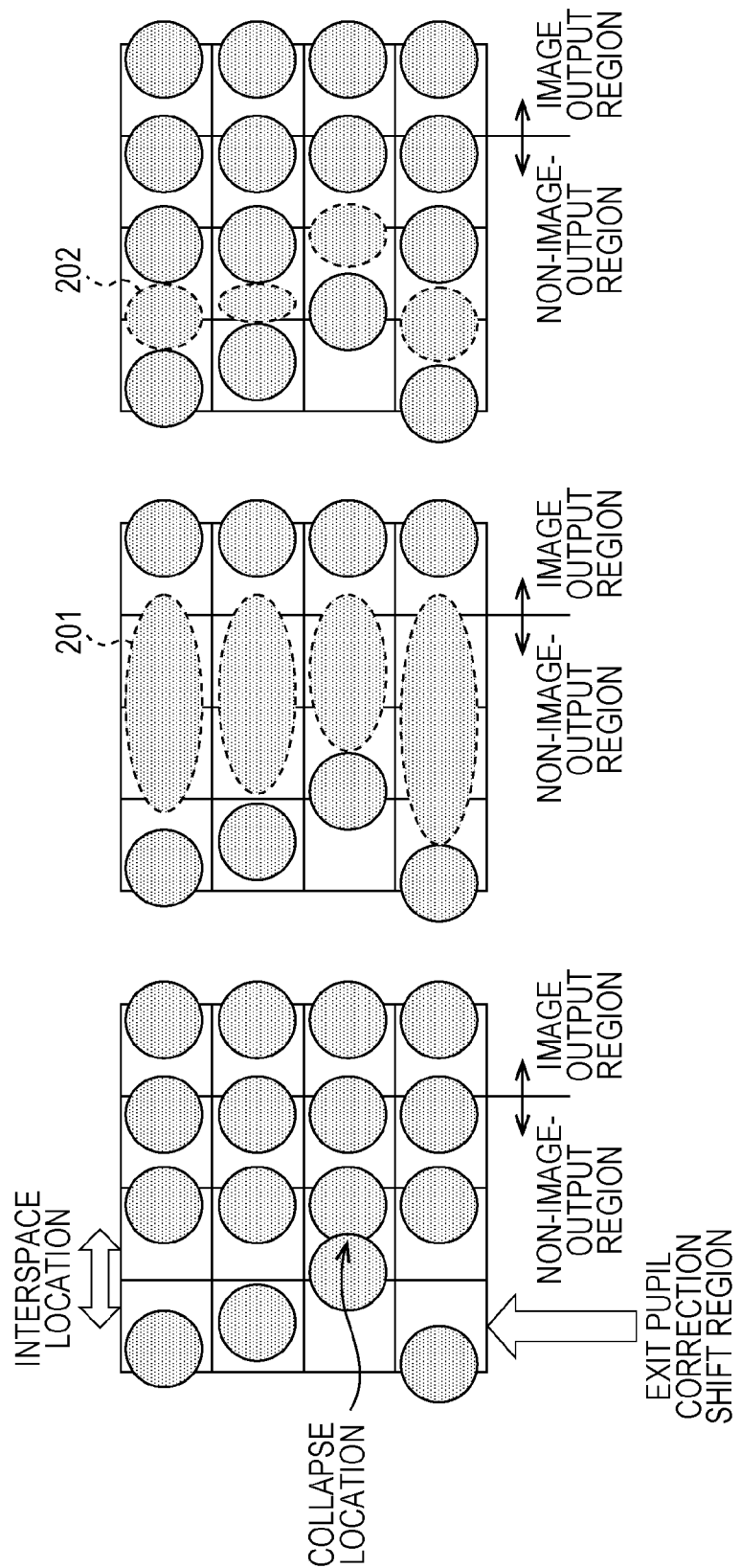
FIG. 13 is a diagram illustrating shapes of on-chip lenses.

Thus, at the boundary between the monitoring pixels and pixels adjacent thereto, the shapes of the on-chip lenses are modified. Specifically, as shown at the center of FIG. 13, by forming large on-chip lenses 201 in which the on-chip lenses of the pixels adjacent to the monitoring pixels and the on-chip lenses of the pixels adjacent to the pixels that are adjacent to the monitoring pixels are combined, the interspace between the on-chip lenses is reduced and/or prevented such that a collapse in the lens shapes do not occur. Further, as shown in the right side of FIG. 13, by forming small on-chip lenses 202 in the interspace between the on-chip lenses and further decreasing the sizes of the on-chip lenses of the adjacent pixels in which the collapse in the shapes occurs, the interspace between the on-chip lenses is reduced and/or prevent such that a collapse in the lens shapes do not occur.

By preventing color mixture between the monitoring pixels and the adjacent pixels, it is possible to stabilize phase difference characteristics which are obtained from the monitoring pixels.

<Light Blocking Pattern of Light Blocking Film>

Figure 14:
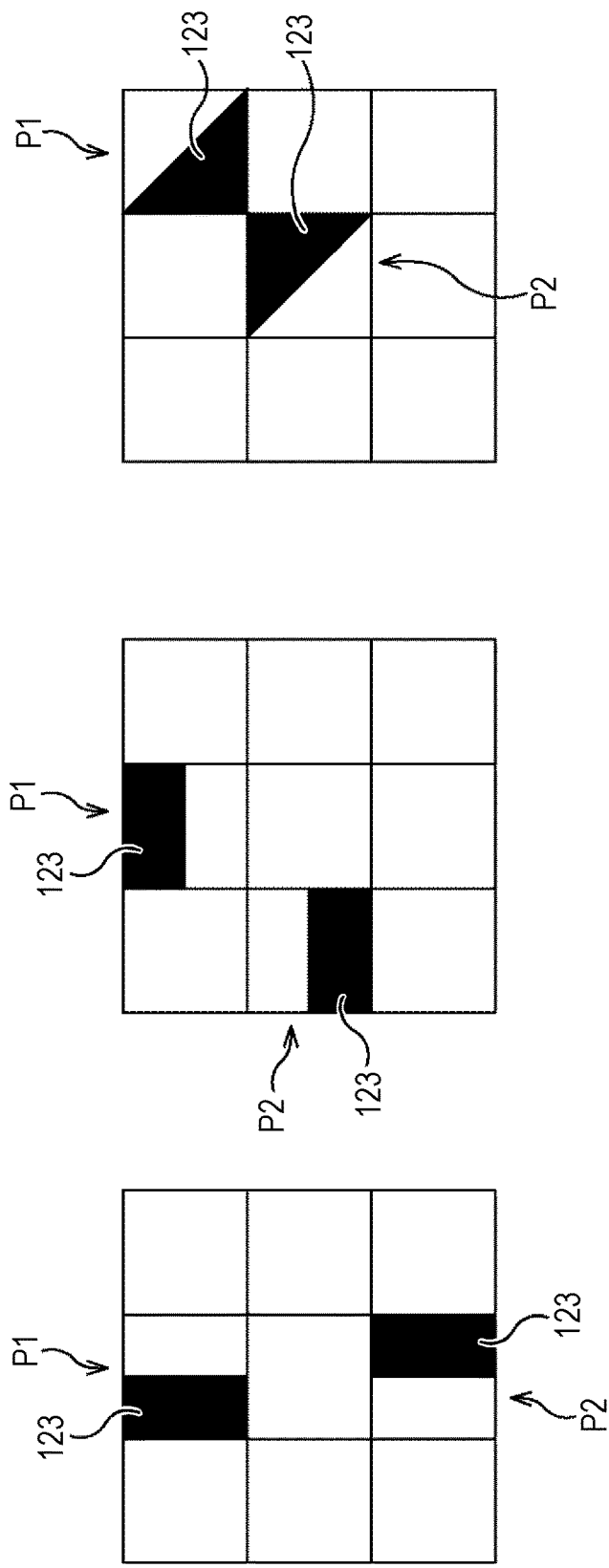
FIG. 14 is a diagram illustrating light blocking patterns of the light blocking film.

In the above description, and in the imaging device according to the present technology, the pair of phase difference detection pixels P1 and P2 is configured such that light is blocked on the left side of the pixel P1 and the right side of the pixel P2 as shown in the left side of FIG. 14. But, in accordance with each pixel arrangement, light may be blocked on the upper side thereof and the lower side thereof as shown at the center of FIG. 14, and obliquely incident light may be blocked as shown in the right side of FIG. 14.

Here, when the monitoring pixels Pa, Pb, and Pc are configured such that light is blocked on the upper side and the lower side as shown at the center of FIG. 14, for example, the monitoring pixels are arranged in the non-image-output region on the sides to the right and left of the image output region in the imaging device 150 of FIG. 9 and the monitoring pixels are arranged in the vicinity of the center of the non-image-output region on the sides above and below the image output region in the imaging device 160 of FIG. 10.

Figure 15:
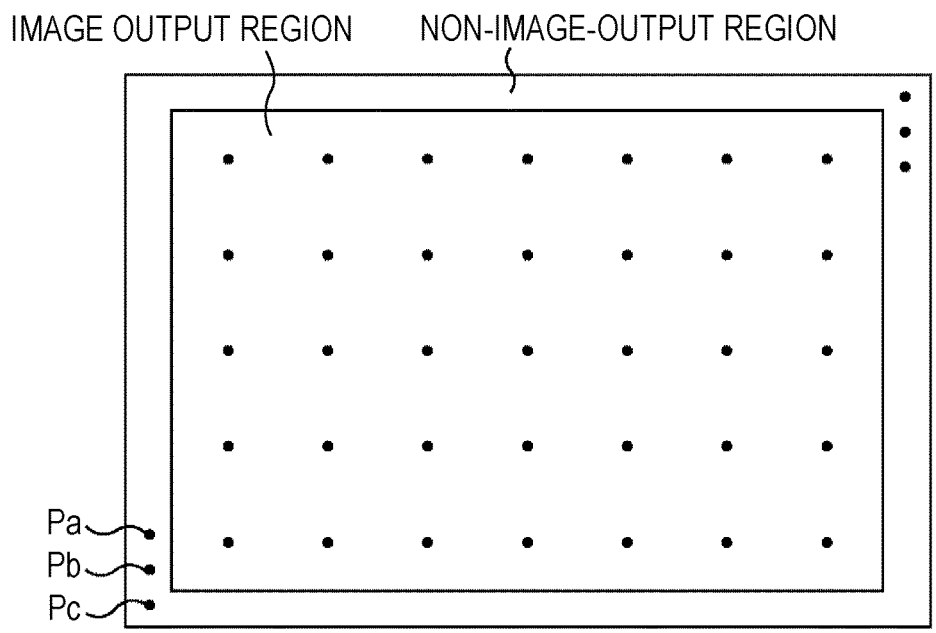
FIG. 15 is a diagram illustrating a further configuration example of the imaging device according to the present technology.

Further, when the monitoring pixels Pa, Pb, and Pc are configured such that obliquely incident light is blocked as shown in the right side of FIG. 14, for example, the monitoring pixels are arranged in locations, which are opposing corners of the whole pixel region, in the non-image-output region as illustrated in FIG. 15.

In the above-mentioned description, a phase difference comprising a difference in the output between the pixels (light blocking pixels), in which light is blocked from reaching parts different from each other as in the left-side light blocking and the right-side light blocking, is used. However, when one pixel is a light blocking pixel, the phase difference is obtained. Therefore, a difference between the light blocking pixel (for example the pixel in which light is blocked on the left side) and the imaging pixel, in which light is not blocked, may be used as the phase difference.

<Another Structural Example of Phase Difference Detection Pixel>

In the present technology, the phase difference detection pixel may employ a structure other than the structures shown in the lower portion of FIG. 9 and the lower portion of FIG. 10.

Figure 16:
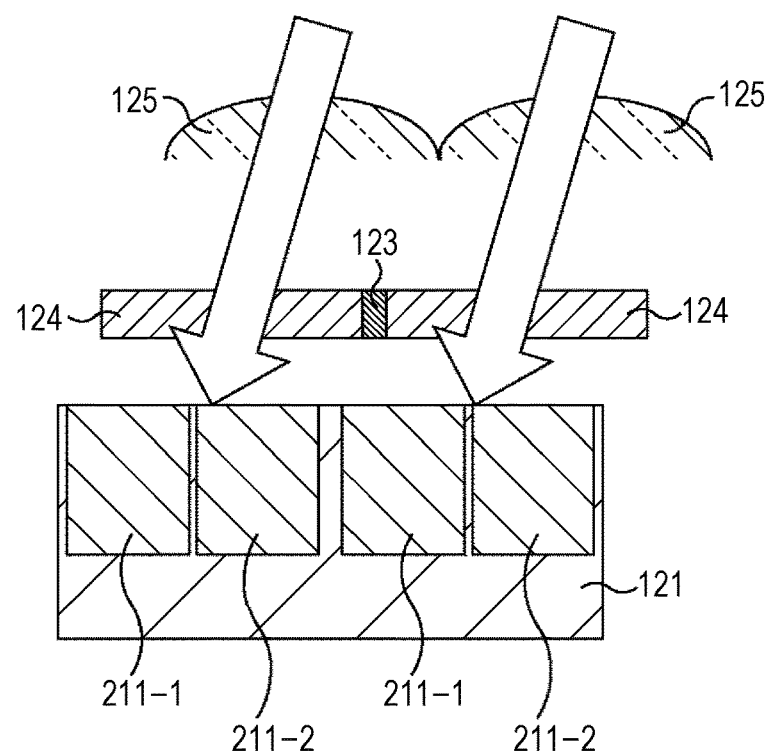
FIG. 16 is a cross-sectional view illustrating another structural example of phase difference detection pixels.

FIG. 16 illustrates a cross-sectional view of another structural example of phase difference detection pixels (including the monitoring pixels) of the present technology.

In the phase difference detection pixels shown in FIG. 16, photodiodes 211-1 and 211-2 as photoelectric conversion sections are formed on the semiconductor substrate 121. Above the semiconductor substrate 121, the light blocking film 123 and the color filters 124 are formed in the same layer, and the on-chip lenses 125 are formed on the layer above thereof. In addition, the light blocking film 123 is formed at the boundary portion between the adjacent pixels and does not block light in the photodiodes 211-1 and 211-2.

Each phase difference detection pixel shown in FIG. 16 includes one on-chip lens 125, the color filter 124 which is formed in the layer below the on-chip lens 125, and the photodiodes 211-1 and 211-2. The photodiodes 211-1 and 211-2 are formed to be separate (separately formed) on the light receiving surface.

When the imaging device according to the present technology includes the phase difference detection pixels having the structure as shown in FIG. 16, the phase difference detection process is performed using the detected difference between the output of the photodiode 211-1 and the output of the photodiode 211-2.

When the monitoring pixels have a structure as shown in FIG. 16, the on-chip lenses 125 are formed to have the amounts of deviation different from the amounts of exit pupil correction corresponding to the arrangement of the monitoring pixels. That is, the optical center of the on-chip lenses 125 may be formed such that the optical center deviates from the center of the monitoring pixels.

According to such a structure, the light, which is incident onto the photodiodes 211-1 and 211-2, is not blocked, and thus it is possible to reduce loss of the amount of the incident light.

<Arrangement of Monitoring Pixels>

In the above description, the monitoring pixels are arranged in the non-image-output region in the imaging device, but may be arranged inside the image output region.

Thereby, it is possible to narrow the non-image-output region and it is possible to reduce the chip size. Additionally, it is possible to obtain the phase difference characteristics in the region from which signals utilized for generating an image are output.

The phase difference characteristics, which are obtained from the monitoring pixels of the above-mentioned imaging device, can be used in the correction of a phase difference detected at the time of performing AF based.

Accordingly, hereinafter, a description will be provided of a configuration of an electronic apparatus that corrects the detected phase difference by phase difference detection on the basis of the phase difference characteristics obtained from the monitoring pixels.

<3. Regarding Electronic Apparatus Equipped with Imaging Device of Present Technology>

<Configuration Example of Electronic Apparatus>

Figure 17:
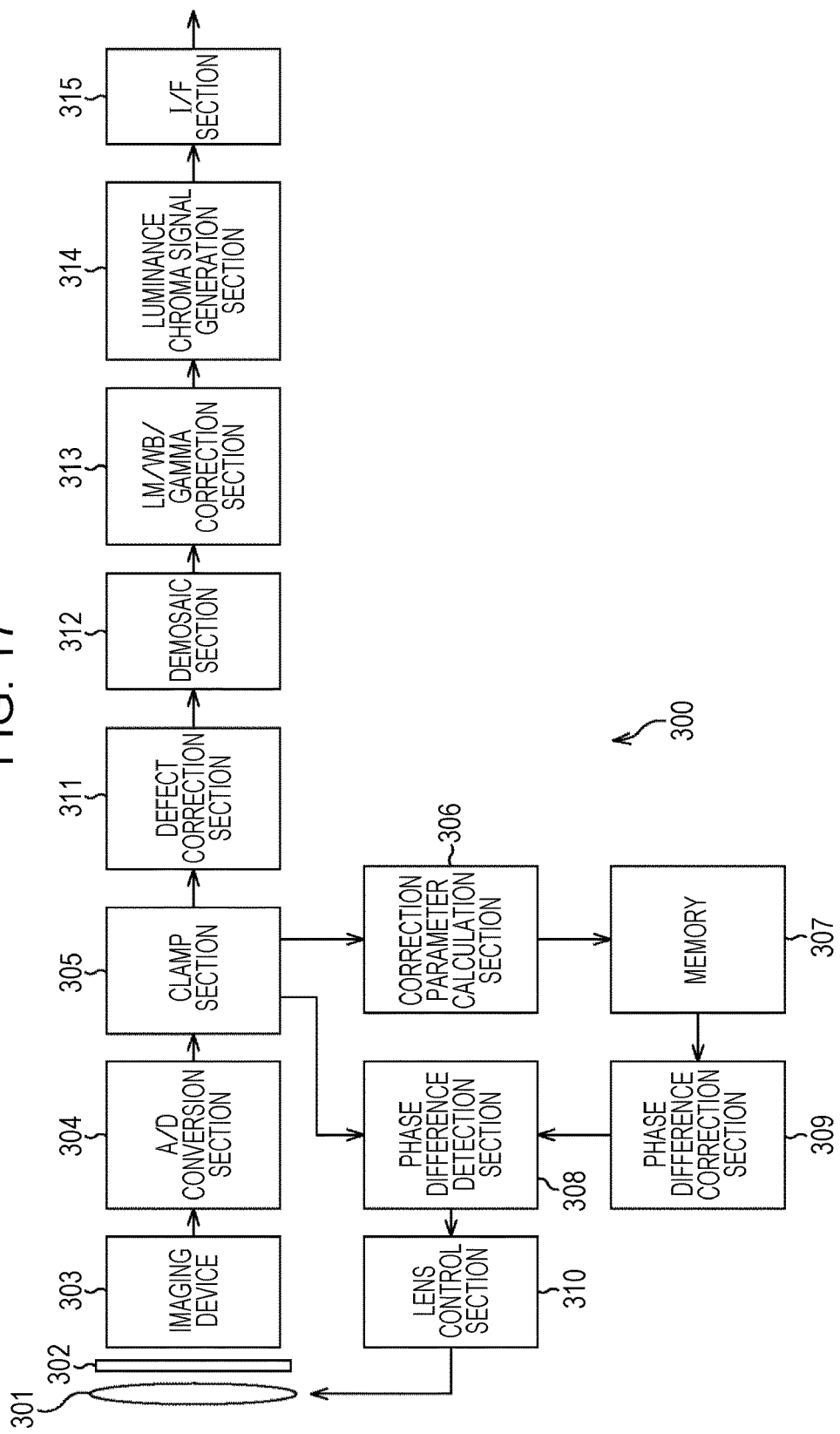
FIG. 17 is a block diagram illustrating a configuration example of an electronic apparatus according to the present technology.

FIG. 17 is a diagram illustrating an example of an electronic apparatus according to the present technology. The electronic apparatus 300 is an apparatus that captures an image of an object by performing phase-difference-detection-type AF (phase difference AF) and outputs the image of the object as an electric signal. The electronic apparatus 300 is formed as, for example, a compact digital camera, a digital single-lens reflex camera, a portable terminal such as a smartphone (multi-function mobile phone) having an imaging function, an endoscope, or the like.

The electronic apparatus 300 includes a lens 301, an optical filter 302, an imaging device 303, an A/D conversion section 304, a clamp section 305, a correction parameter calculation section 306, memory 307, a phase difference detection section 308, a phase difference correction section 309, a lens control section 310, a defect correction section 311, a demosaic section 312, a linear matrix (LM)/white balance (WB)/gamma correction section 313, a luminance chroma signal generation section 314, and an interface (I/F) section 315.

The lens 301 adjusts the focal length of object light incident into the imaging device 303. After the lens 301, an aperture diaphragm (not shown in the drawing), which adjusts an amount of object light incident into the imaging device 303, is provided. The specific configuration of the lens 301 is arbitrary, and for example, the lens 301 may be formed of a plurality of lenses.

The object light, which is transmitted through the lens 301, is incident into the imaging device 303 through the optical filter 302 formed as, for example, an IR cut filter, which transmits light other than infrared light, or the like.

The imaging device 303 corresponds to the above-mentioned imaging device 150 or imaging device 160 according to the present technology, and includes a plurality of pixels (imaging pixels, phase difference detection pixels, and monitoring pixels) having photoelectric conversion elements such as photodiodes that photoelectrically convert the object light. Each pixel converts the object light into an electric signal and supplies the electric signal to the A/D conversion section 304.

The imaging device 303 comprises a solid-state imaging device according to the present technology, together with a signal process circuit which implements the A/D conversion section 304, the clamp section 305, the phase difference detection section 308, and the phase difference correction section 309. As described later, the solid-state imaging device may be formed as a single-chip module, and the imaging device 303 and the signal process circuit may be formed as separate chips. Further, the signal process circuit may include the correction parameter calculation section 306 and the memory 307.

The solid-state imaging device according to the present technology may be, for example, a CCD image sensor that transfers electric charge, which is generated from light, by using a circuit element, which is called a charge coupled device (CCD), in order for the photoelectric conversion elements to read the electric charge. The solid-state imaging device according to the present technology may be, for example a CMOS image sensor that uses a complementary metal oxide semiconductor (CMOS) and has an amplifier for each unit cell.

The A/D conversion section 304 converts an RGB electric signal (analog signal), which is supplied from the imaging device 303, into digital data (image data). The A/D conversion section 304 supplies the image data (RAW data) as the digital data to the clamp section 305.

The clamp section 305 subtracts a black level, which is a level at which it is determined that the color is black, from the image data. The clamp section 305 supplies the data, which is output from the monitoring pixels, among the image data pieces (pixel values), from which the black level is subtracted, to the correction parameter calculation section 306. Further, the clamp section 305 supplies the image data (pixel values), which is output from the phase difference detection pixels, to the phase difference detection section 308, and supplies a piece of the image data, from which the black level is subtracted and which corresponds to all pixels, to the defect correction section 311.

That is, in the phase difference detection, only the outputs of the phase difference detection pixels are used. However, when an image is generated, the output of the imaging pixels and also the output of the phase difference detection pixels are used. Here, in the phase difference detection pixel, as shown in FIG. 2 or 4, when light is blocked by the light blocking film 123 in a half portion of the photoelectric conversion section, the output of the phase difference detection pixel is lower than the output of the imaging pixel. Thus, as described later, defect correction is performed. Further, in the phase difference detection pixel, as shown in FIG. 16, when light is not blocked by the light blocking film 123 in the photoelectric conversion section, the output of the phase difference detection pixel is used as is.

The correction parameter calculation section 306 calculates a correction parameter, which is used in correcting the phase difference detected by the phase difference detection section 308, on the basis of the data of the phase difference characteristics obtained in a test process performed after manufacture of the imaging device 303 or a test process performed after the lens 301 is mounted on the imaging device 303.

The memory 307 stores the correction parameter which is calculated by the correction parameter calculation section 306.

The phase difference detection section 308 performs a phase difference detection process on the basis of the image data (pixel values) supplied from the clamp section 305 so as to determine whether or not the object (focusing target) as a target to be focused is in focus. When the object is in focus in the focus area, the phase difference detection section 308 supplies, as a focusing determination result, information, which indicates the in-focus state, to the lens control section 310. Further, when the focusing target is defocused or otherwise out of focus, the phase difference detection section 308 calculates an amount of focal deviation (amount of defocus), and supplies, as a focusing determination result, information, which indicates the calculated amount of defocus, to the lens control section 310.

The phase difference correction section 309 corrects the phase difference, which is detected by the phase difference detection section 308, by using the correction parameter which is stored in the memory 307. That is, the phase difference detection section 308 supplies the focusing determination result, which corresponds to the corrected phase difference, to the lens control section 310.

The lens control section 310 controls driving of the lens 301. Specifically, the lens control section 310 calculates an amount of driving of the lens 301 on the basis of the focusing determination result supplied from the phase difference detection section 308, and moves the lens 301 in accordance with the calculated amount of driving. Stated another way, based on the determination result provided by the phase difference detection section 308, the lens control section 310 calculates an amount to move the lens 301 such that the object is in focus.

For example, when focus is appropriate or otherwise in focus, the lens control section 310 maintains the current position of the lens 301. When focus is inappropriate or otherwise defocused or out of focus, the lens control section 310 calculates the amount of driving on the basis of the focusing determination result, which indicates the amount of defocus, and the position of the lens 301, and moves the lens 301 in accordance with the amount of driving.

The defect correction section 311 performs pixel value correction, or defect correction on defect pixels (for example, the phase difference detection pixels) of which pixel values are incorrect. Such defect correction is performed on the basis of the image data supplied from the clamp section 305. The defect correction section 311 supplies the image data, on which the correction for defect pixels is performed, to the demosaic section 312.

The demosaic section 312 performs a demosaic process on the RAW data from the defect correction section 311, and converts the RAW data into the RGB data by performing compensation of color information and the like. The demosaic section 312 supplies the image data (RGB data) subjected to the demosaic process to the LM/WB/gamma correction section 313.

The LM/WB/gamma correction section 313 performs correction of color characteristics on the RGB data from the demosaic section 312. Specifically, the LM/WB/gamma correction section 313 corrects each color signal of the image data by using a matrix coefficient in order to compensate for a difference between standardized chromaticity points of primary colors (RGB) and actual chromaticity points of a camera, to ensure color reproducibility. Further, the LM/WB/gamma correction section 313 adjusts white balance by setting a gain of white relative to a value of each channel of RGB data. Furthermore, the LM/WB/gamma correction section 313 performs a gamma correction by adjusting a relative relationship between the colors of the image data and the output device characteristics. The LM/WB/gamma correction section 313 supplies the corrected image data (RGB data) to the luminance chroma signal generation section 314.

The luminance chroma signal generation section 314 generates a luminance signal (Y) and color difference signals (Cr and Cb) from the RGB data which is supplied from the LM/WB/gamma correction section 313. The luminance chroma signal generation section 314 generates the luminance chroma signals (Y, Cr, and Cb), and then supplies the luminance signal and the color difference signals to the I/F section 315.

The I/F section 315 outputs the supplied image data (luminance chroma signal) to the external device (such as a storage device that stores the image data or a display device that displays an image of the image data) of the electronic apparatus 300.

Here, referring to FIG. 18, a basic schematic configuration of the solid-state imaging device according to the present technology will be described.

Figure 18:
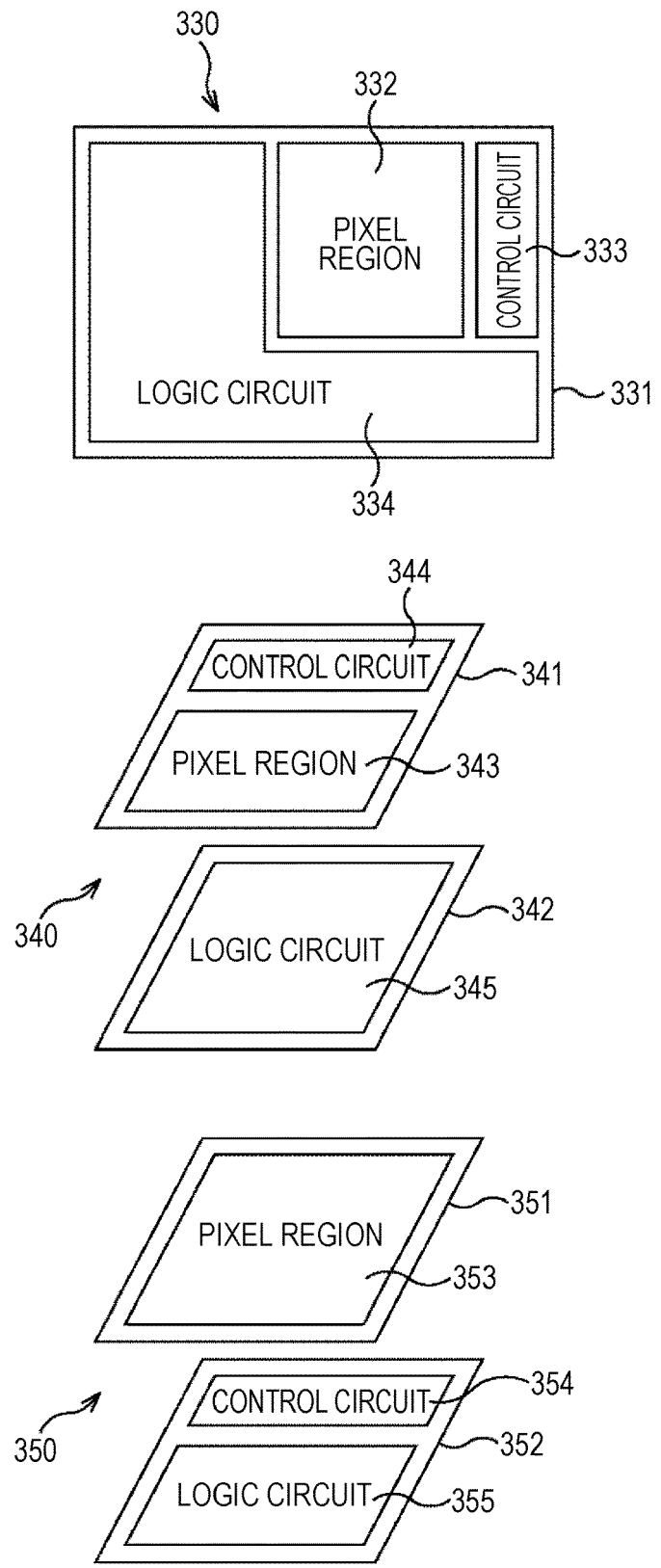
FIG. 18 is a diagram illustrating a basic schematic configuration of a solid-state imaging device according to the present technology.

In a first example, the solid-state imaging device 330 shown in the upper portion of FIG. 18 is configured to include a pixel region 332, a control circuit 333, and a logic circuit 334 including the above-mentioned signal process circuit in a single semiconductor chip 331.

In a second example, the solid-state imaging device 340 shown at the middle of FIG. 18 includes a first semiconductor chip section 341 and a second semiconductor chip section 342. The first semiconductor chip section 341 includes a pixel region 343 and a control circuit 344, and the second semiconductor chip section 342 includes a logic circuit 345 including the above-mentioned signal process circuit. In addition, by electrically connecting the first semiconductor chip section 341 and the second semiconductor chip section 342 to each other, the solid-state imaging device 340 may be configured as a single semiconductor chip.

In the third example, the solid-state imaging device 350 shown in the lower portion of FIG. 18 includes a first semiconductor chip section 351 and a second semiconductor chip section 352. The first semiconductor chip section 351 includes a pixel region 353, and the second semiconductor chip section 352 is includes a control circuit 354 and a logic circuit 355 including the above-mentioned signal process circuit. In addition, by electrically connecting the first semiconductor chip section 351 and the second semiconductor chip section 352 to each other, the solid-state imaging device 350 may be configured as a single semiconductor chip.

<Regarding Phase Difference AF Process>

Referring to the flowchart of FIG. 19, a phase difference AF process performed by the electronic apparatus 300 will be described. The phase difference AF process is executed before the imaging process which is executed by the electronic apparatus 300 when an image of an object is captured.

First, in step S101, the imaging device 303 photoelectrically converts the incident light of each pixel, reads each pixel signal, and supplies the signal to the A/D conversion section 304.

In step S102, the A/D conversion section 304 A/D-converts each pixel signal supplied from the imaging device 303, and supplies the converted signal to the clamp section 305.

In step S103, the clamp section 305 subtracts the black level, which is detected in an Optical Black (OPB) region provided outside the effective pixel region, from each pixel signal (pixel value) supplied from the A/D conversion section 304. The clamp section 305 supplies the image data (pixel values), which is output from the phase difference detection pixels, among the image data pieces, from which the black level is subtracted, to the phase difference detection section 308.

In step S104, the phase difference correction section 309 reads the correction parameter which is calculated in advance and stored in the memory 307.

In step S105, the phase difference detection section 308 performs phase difference detection on the basis of the image data (pixel values) supplied from the clamp section 305.

Then, in step S106, the phase difference correction section 309 corrects the phase difference, which is detected by the phase difference detection section 308, by using the read correction parameter.

Here, referring to FIG. 20, phase difference correction will be described.

As described above, in the imaging device according to the present technology, it is possible to obtain the phase difference characteristics even where the lens 301 is mounted. Accordingly, as the phase difference characteristics of a normal product, the characteristics shown in the upper portion of FIG. 20 are obtained. Likewise, as the phase difference characteristics of an irregular product, the characteristics shown in the lower portion of FIG. 20 are obtained.

In each set of phase difference characteristics shown in FIG. 20, there exists a difference between the normal product and the irregular product in terms of the slopes of the outputs of the phase difference detection pixels in the range of the angle, at which light is incident onto the imaging device, determined by the F number and the like of the lens 301. Where the slope is small, there is a small difference between the output of the pixel, in which light is blocked on the right side, and the output of the pixel, in which light is blocked on the left side, when a bias in the incident angle is caused by the focal deviation. That is, like the irregular product B in FIG. 8, compared with the normal product, the amount of focal deviation relative to phase difference is large. In other words, when focus is greatly deviated, phase difference is unlikely to occur.

In the present technology, by calculating the correction coefficient Beta as a correction parameter for correcting the slope, the phase difference relative to the amount of focal deviation is corrected.

In the phase difference characteristics of the normal product shown in the upper portion of FIG. 20, the slope of the output of the pixel in which light is blocked on the left side is referred to as a slope A, and the slope of the output of the pixel in which light is blocked on the right side is referred to as a slope B. Likewise, in the phase difference characteristics of the irregular product shown in the lower portion of FIG. 20, the slope of the output of the pixel in which light is blocked on the left side is referred to as a slope C, and the slope of the output of the pixel in which light is blocked on the right side is referred to as a slope D.

At this time, the correction coefficient Beta is obtained by the following expressions (1) and (2).

(Math. 1)

$$\text{Beta} = (\text{Slope } A * \text{Slope } B)/(\text{Slope } C * \text{Slope } D) \quad (1)$$

(Math. 2)

$$\text{Beta} = (\text{Slope } A + \text{Slope } B)/(\text{Slope } C + \text{Slope } D) \quad (2)$$

Figure 21:
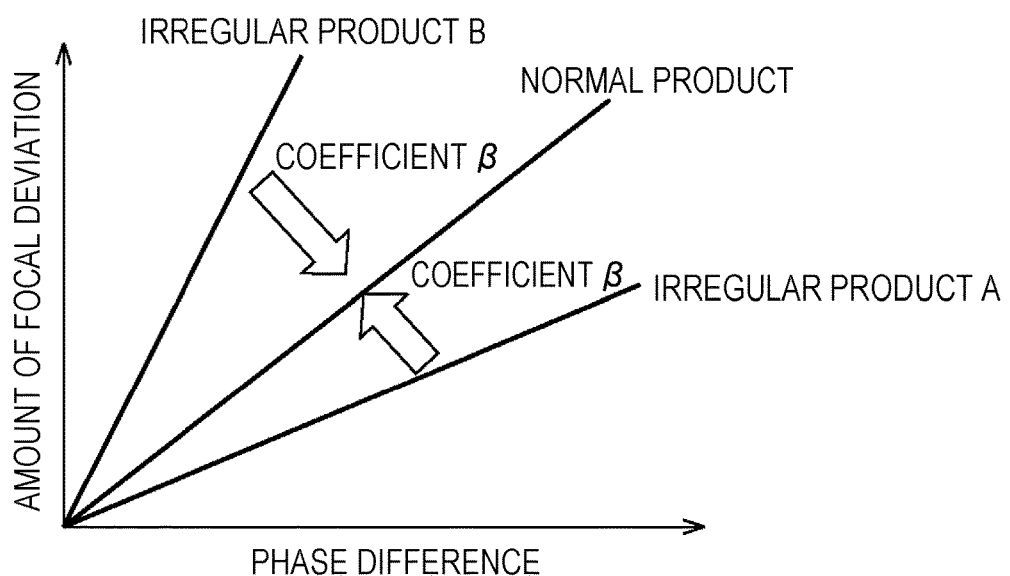
FIG. 21 is a diagram illustrating correction of a phase difference based on the correction parameter.

On the basis of the correction coefficient Beta calculated as described above, the phase difference relative to the amount of focal deviation of the irregular product in FIG. 8 is corrected to be close to that of the normal product as shown in FIG. 21.

Further, in the present technology, on the basis of the following expressions (3) and (4), a correction coefficient Beta' for the pixel, in which light is blocked on the left side, and a correction coefficient Beta" for the pixel, in which light is blocked on the right side, may be calculated, and a combination thereof may be used.

(Math. 3)

$$\text{Beta}' = \text{Slope } A/\text{Slope } C \quad (3)$$

(Math. 4)

$$\text{Beta}'' = \text{Slope } B/\text{Slope } D \quad (4)$$

It should be noted that each slope may be a value as it is, may be an absolute value thereof, and may be weighted by a predetermined weight as necessary. Further, the correction coefficient Beta may be adjusted in accordance with the F number of the lens 301 and a photography environment, such as the objects and a light source. In this case, by storing the slope (correction parameter) for each F number or photography environment calculated using the phase difference characteristics for each F number or photography environment in the memory 307 in advance, the correction coefficient Beta may be adjusted. Alternatively, by adaptively using predetermined expressions and tables through scene determination, the correction coefficient Beta may be adjusted.

When the phase difference is corrected as described above in step S107, the phase difference detection section 308 supplies the focusing determination result to the lens control section 310. The focusing determination result corresponds to the corrected phase difference.

In step S108, the lens control section 310 controls driving of the lens 301, on the basis of the focusing determination result supplied from the phase difference detection section 308.

According to the above-mentioned process, on the basis of the phase difference characteristics obtained in advance, even when there are manufacturing variations, it is possible to correct the phase difference, and to prevent the accuracy of AF from being reduced.

In the above description, at the time of the phase difference AF process, the correction coefficient Beta is calculated on the basis of the correction parameter calculated in advance, and thereby the phase difference is corrected. However, the correction parameter calculation section 306 may calculate the correction coefficient Beta in advance, and the phase difference correction section 309 may correct the phase difference by using the correction coefficient Beta.

In addition, the lens control section 310 controls driving of the lens 301 by performing contrast AF in addition to the above-mentioned phase difference AF. For example, when the information indicating the amount of focal deviation (amount of defocus) as the focusing determination result is supplied from the phase difference detection section 308, the lens control section 310 may determine the direction of the focal deviation (whether the focal point is before the object or is after the object), and may perform the contrast AF in the direction.

Further, in the imaging device 160 shown in FIG. 10, the monitoring pixels are arranged at the image heights on the left side and right side of the image output region. However, the correction parameters, which are obtained on the basis of the respective monitoring pixels, may be averaged and used and may be used for each image height.

For example, it is assumed that the correction parameter based on the monitoring pixel disposed on the left side of the image output region is Omega and the correction parameter based on the monitoring pixel disposed on the right side of the image output region is Eta. In this case, by an amount of change in the angle of view from the left side to the right side, the correction parameter may be shifted from Omega to Eta.

<Regarding Imaging Process>

Referring to the flowchart of FIG. 22, the imaging process performed by the electronic apparatus 300 will be described.

Figure 19:
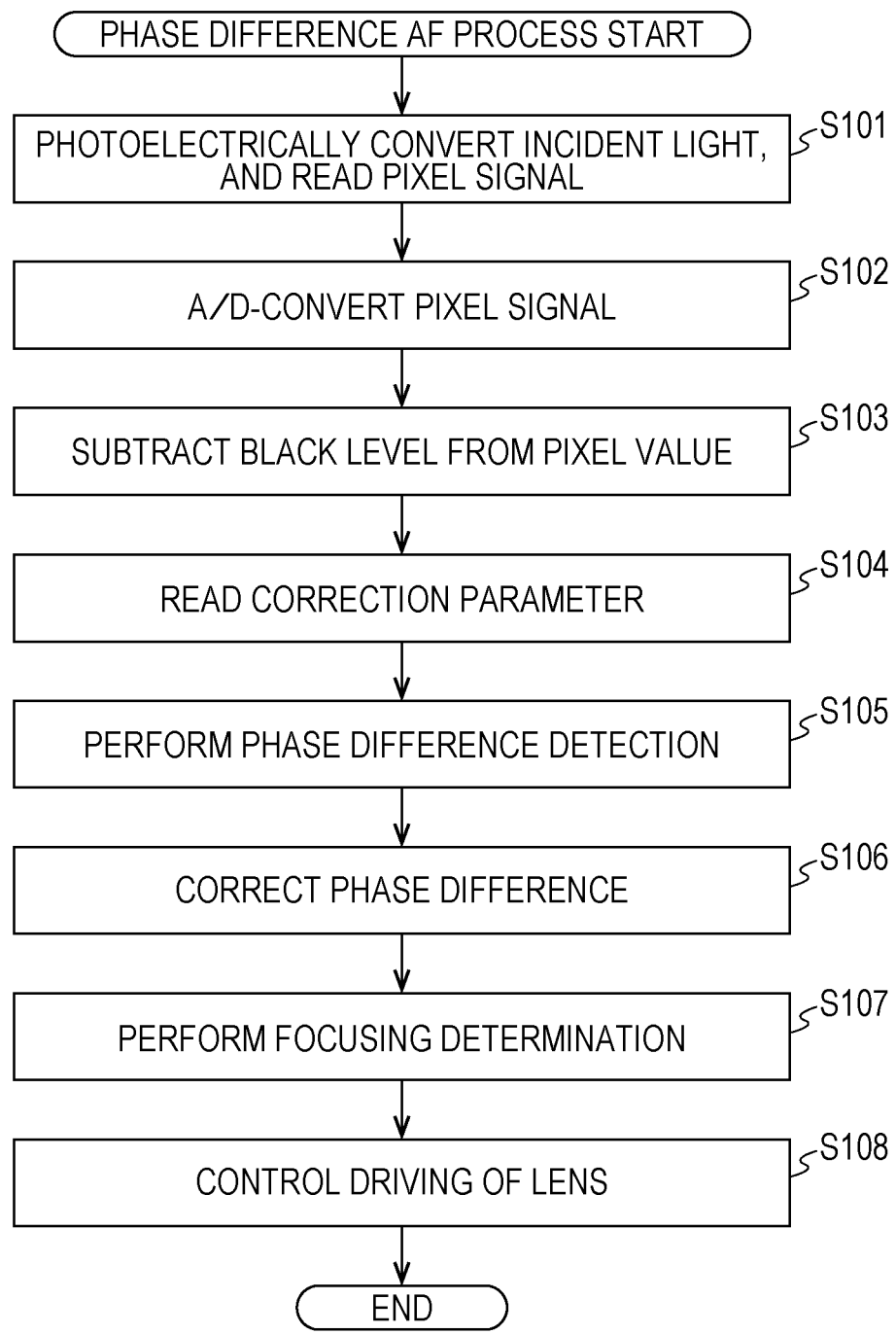
FIG. 19 is a flowchart illustrating a phase difference AF process.
Figure 22:
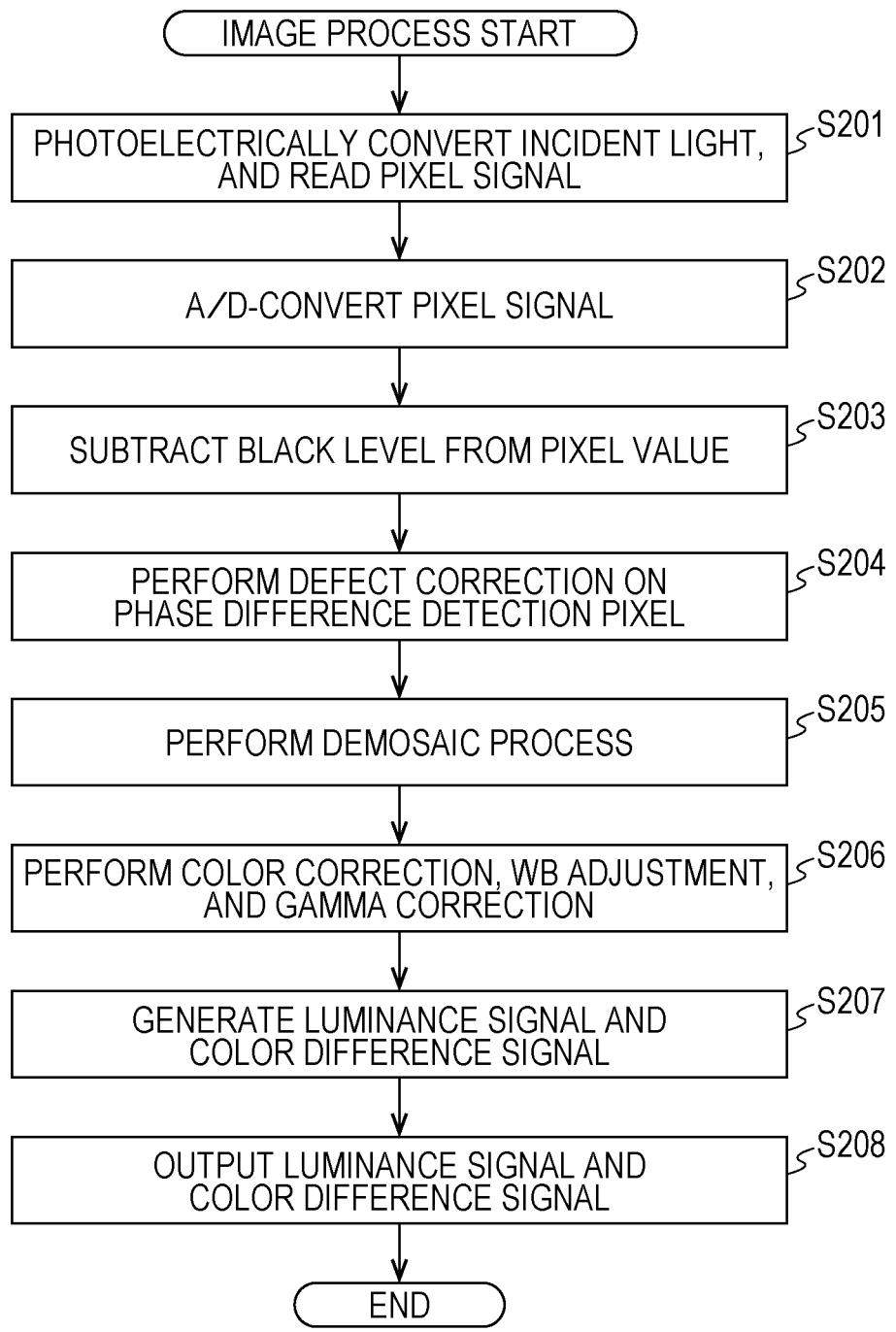
FIG. 22 is a flowchart illustrating an imaging process.

Here, the process of steps S201 to S203 of the flowchart of FIG. 22 is the same as the process of steps S101 to S103 of the flowchart of FIG. 19, and thus the description thereof will be omitted. In addition, in step S203, the clamp section 305 supplies the image data (pixel values) of all pixels, from which the black level is subtracted, to the defect correction section 311.

In step S204, the defect correction section 311 performs pixel value correction (defect correction) on the defect pixels of which pixel values are incorrect. Here, in the imaging device 303, when the monitoring pixels are arranged inside the image output region, the monitoring pixels are also subjected to the defect correction. The image data, on which the correction for defect pixels is performed, is supplied to the demosaic section 312.

In step S205, the demosaic section 312 performs the demosaic process, converts the RAW data into the RGB data, and supplies the data to the LM/WB/gamma correction section 313.

In step S206, the LM/WB/gamma correction section 313 performs color correction, adjustment of white balance, and gamma correction on the RGB data supplied from the demosaic section 312, and supplies the data to the luminance chroma signal generation section 314.

In step S207, the luminance chroma signal generation section 314 generates the luminance signal and the color difference signal (YCrCb data) from the RGB data.

Then, in step S208, the I/F section 315 outputs the luminance signal and the color difference signal, which are generated by the luminance chroma signal generation section 314, to an external storage device or a display device, and ends the imaging process.

According to the above-mentioned process, it is possible to capture an image without reducing the accuracy of AF, and therefore resulting in a better image.

<Application of Imaging Pixels>

As the monitoring pixels, the phase difference detection pixels, which have the amounts of deviation different from the amounts of exit pupil correction corresponding to the arrangement, have been described above. However, this configuration may be applied to the imaging pixels (hereinafter referred to as normal pixels).

In this case, the normal pixels are arranged in, for example, the non-image-output regions described with reference to FIGS. 9 and 10, together with the monitoring pixels.

Figure 23:
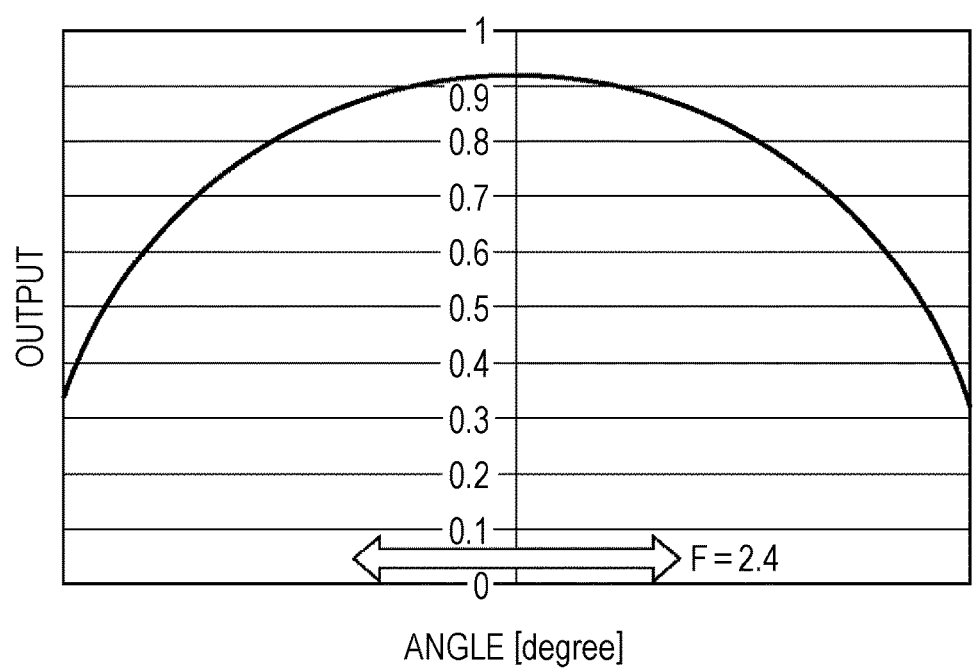
FIG. 23 is a diagram illustrating an incident angle dependent characteristic of the imaging pixel.

Thereby, for example, it is possible to obtain the incident angle dependent characteristic shown in FIG. 23. In addition, the incident angle dependent characteristic can be obtained in a similar manner to the phase difference characteristics of the monitoring pixels (phase difference detection pixels).

When the F number of the lens 301 is set to for example 2.4, in the incident angle dependent characteristic of FIG. 23, the range of the angle, at which the incident light is incident, is the range indicated by the arrow, and the outputs of the normal pixels are integral values in the angular range.

Here, by comparing the output of the normal pixel with the output of the monitoring pixel obtained in the above-mentioned angular range of the phase difference characteristics of FIG. 12, it is possible to determine by which degree the output of the monitoring pixel is reduced relative to the output of the normal pixel.

In the phase difference detection pixels which are arranged inside the image output region, light is blocked from reaching a part of the light receiving portion, and thus the defect correction section 311 performs the defect correction. At this time, and in accordance with by which degree the output of the monitoring pixel is reduce relative to the output of the normal pixel, a gain corresponding to the reduction amount is applied to the output of the phase difference detection pixel, whereby it is possible to perform the defect correction.

In the present technology, in a similar manner to the above-mentioned correction coefficient Beta, the gain is adjusted in accordance with the F number of the lens 301 and the photography environment. Specifically, when the F number of the lens 301 or the photography environment changes, in accordance with how the difference between the output of the normal pixel and the output of the phase difference detection pixel changes, a gain to apply is adaptively calculated. In addition, in accordance with the phase state depending on the output of the phase difference detection pixel, the gain may be adjusted.

<Another Configuration Example of Electronic Apparatus>

Figure 24:
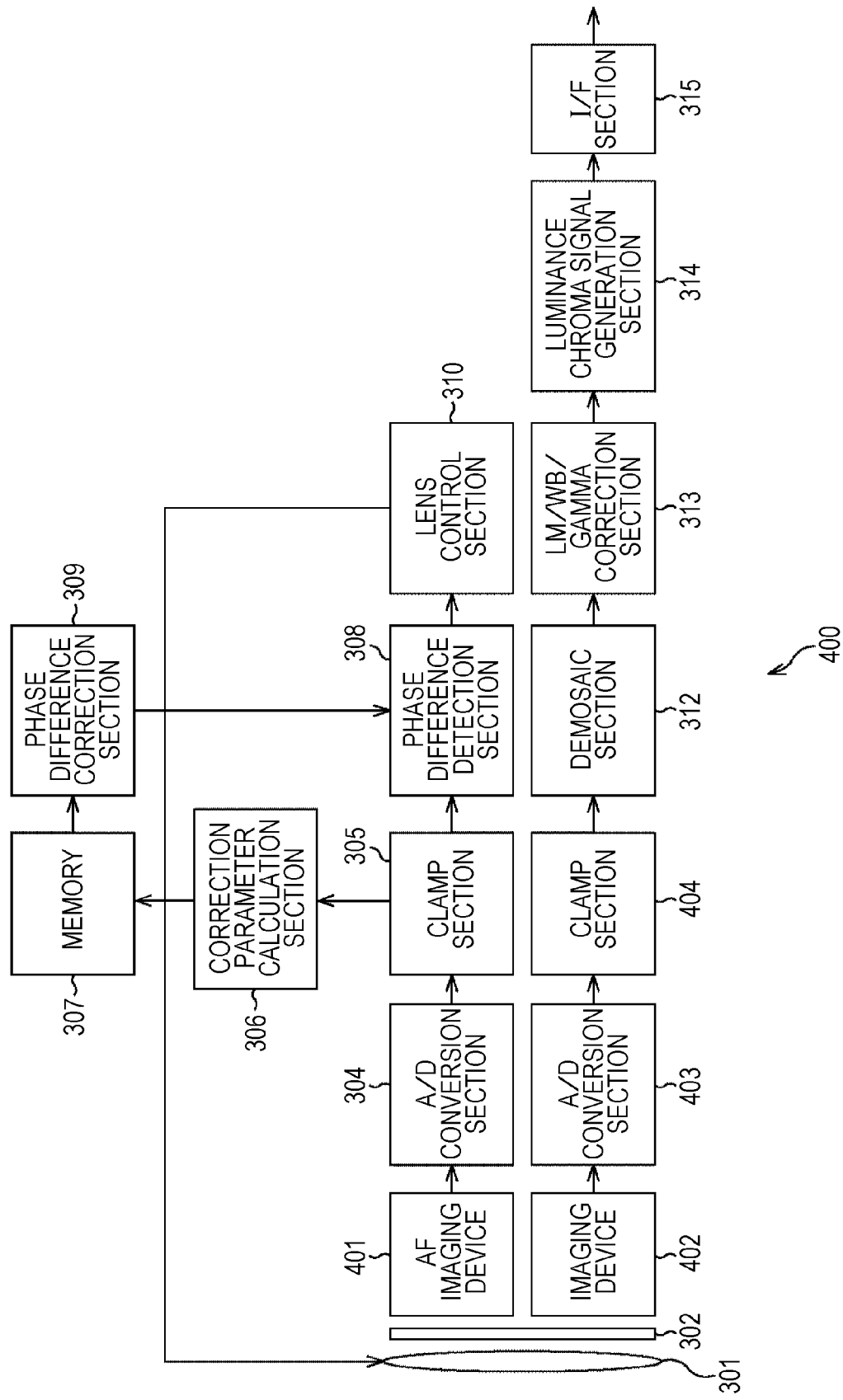
FIG. 24 is a block diagram illustrating another configuration example of the electronic apparatus according to the present technology.

FIG. 24 is a block diagram illustrating another configuration example of an electronic apparatus according to the present technology.

The electronic apparatus 400 shown in FIG. 24 includes the lens 301, the optical filter 302, an AF imaging device 401, the A/D conversion section 304, the clamp section 305, the memory 307, the phase difference detection section 308, the phase difference correction section 309, the lens control section 310, an imaging device 402, an A/D conversion section 403, a clamp section 404, the demosaic section 312, the LM/WB/gamma correction section 313, the luminance chroma signal generation section 314, and the I/F section 315.

In the electronic apparatus 400 of FIG. 24, the components having functions the same as the functions provided in the electronic apparatus 300 of FIG. 17 are referenced by the same names, reference numerals, and signs; therefore, the descriptions thereof will be appropriately omitted.

In the configuration of the AF imaging device 401, contrary to that of the imaging device 303 provided in the electronic apparatus 300 of FIG. 17, the imaging pixels are not arranged, but only the phase difference detection pixels including the monitoring pixels are arranged. It should be noted that the monitoring pixels may have the configuration described with reference to FIG. 9, and may have the configuration described with reference to FIG. 10.

In the configuration of the imaging device 402, contrary to the imaging device 303 provided in the electronic apparatus 300 of FIG. 17, the phase difference detection pixels and the monitoring pixels are not arranged, but only the normal imaging pixels are arranged.

The A/D conversion section 403 converts the electric signal (analog signal) of RGB, which is supplied from the imaging device 402, into digital data (image data), and supplies the data to the clamp section 404.

The clamp section 404 subtracts a black level, which is a level at which it is determined that the color is black, from the image data, and supplies a piece of the image data, from which the black level is subtracted and which corresponds to all pixels, to the demosaic section 312.

The AF imaging device 401 constitutes a solid-state imaging device according to the present technology, together with a signal process circuit which implements the A/D conversion section 304, the clamp section 305, the phase difference detection section 308, and the phase difference correction section 309. As described with reference to FIG. 18, the solid-state imaging device may be also formed as a single-chip module, and the AF imaging device 401 and the signal process circuit may be formed as separate chips. Further, the signal process circuit may include the correction parameter calculation section 306 and the memory 307.

In the above-mentioned configuration, even when there are manufacturing variations, it is also possible to correct the phase difference. Therefore, even when there are manufacturing variations, it is possible to prevent the accuracy of AF from being reduced.

Further, it is not necessary to provide the phase difference detection pixels in the imaging device 402 which is normally used to capture an image. Thus, it is not necessary to perform the defect correction on the phase difference detection pixels. Furthermore, the AF imaging device 401 and the imaging device 402 can be separately manufactured. Therefore, it is possible to perform manufacture through respectively optimized processes.

As described above, the electronic apparatus including the solid-state imaging device according to the present technology can be applied to compact digital cameras, digital single-lens reflex cameras, portable terminals such as a smartphone, endoscopes, and the like.

<Example of Application to Digital Single-Lens Reflex Camera>

Figure 25:
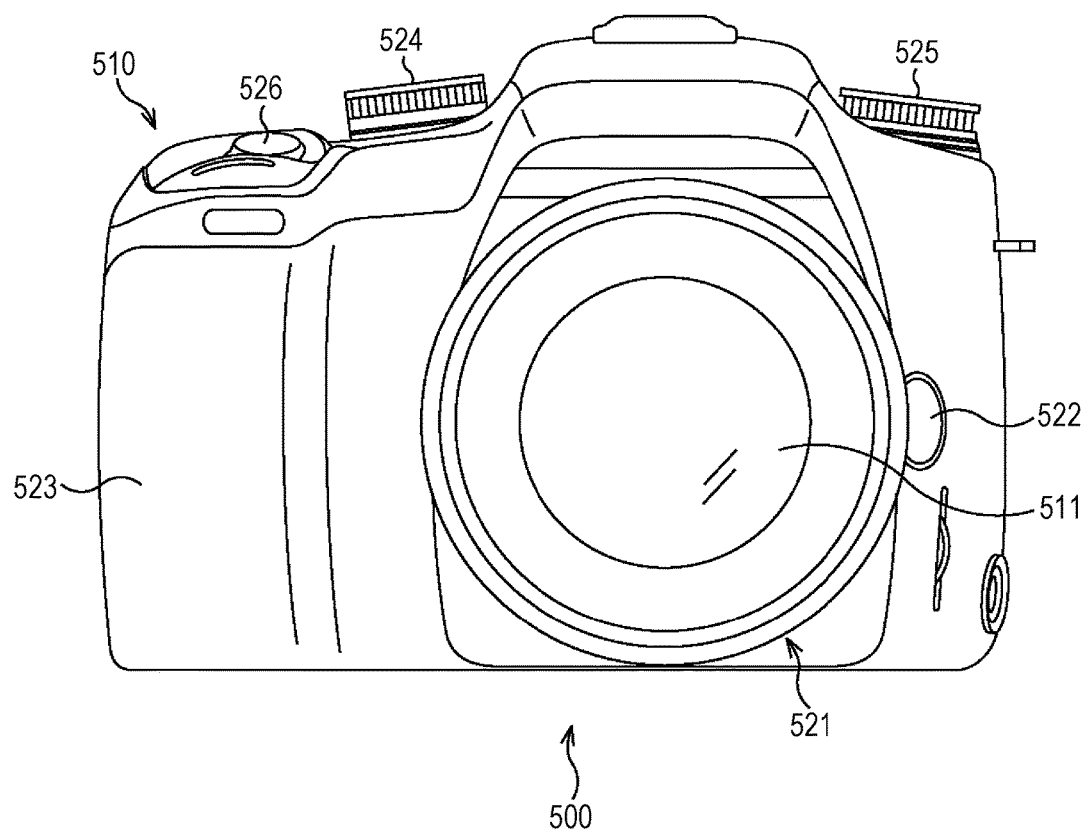
FIG. 25 is a diagram illustrating a configuration of appearance of an imaging apparatus according to the present technology.

FIG. 25 is a front view illustrating an exterior configuration of a digital single-lens reflex camera according to the present technology.

A digital single-lens reflex camera 500 (hereinafter simply referred to as a camera 500) includes a camera body 510 and an interchangeable lens 511 (hereinafter simply referred to as a lens 511) as a photography lens which is removable from the camera body 510.

In FIG. 25, on the front side of the camera body 510, there are provided a mount section 521 on which the interchangeable lens 511 is mounted at substantially the center of the front, a lens exchange button 522 that is disposed on the right side of the mount section 521 in the horizontal direction, and a grip section 523 that is graspable.

Further, on the upper side of the camera body 510, there are provided a mode setting dial 524 that is disposed on the left upper section of the front, a control value setting dial 525 that is disposed on the right upper side of the front, and a shutter button 526 that is disposed on the upper side of the grip section 523.

Although not shown in the drawing, on the rear side of the camera body 510, there are provided a liquid crystal display (LCD), various kinds of buttons and keys, an electronic view finder (EVF), and the like.

The camera 500 has a configuration and a function the same as those of the electronic apparatus 300 of FIG. 17.

In such a camera 500, the F number of the lens 511 is set as a predetermined value by, for example, an operation which is performed using the control value setting dial 525 by a user. However, as described above, the phase difference characteristics of the phase difference detection pixel are different depending on the F number.

Figure 26:
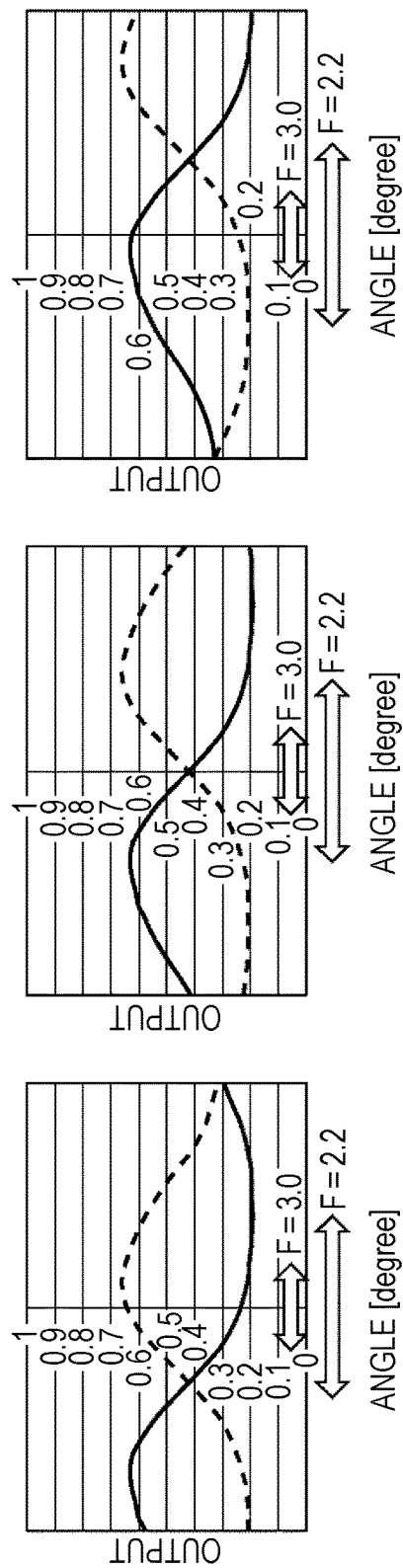
FIG. 26 is a diagram illustrating phase difference characteristics in which there are variations.

FIG. 26 depicts an example of the phase difference characteristics when deviation occurs.

In each set of phase difference characteristics shown in FIG. 26, the output of the phase difference detection pixel is an integral value (an integral value in which the lens characteristics are considered) of the angular range of the incident angle indicated by the arrow. However, the angular range is different depending on the F number of the lens, and thus the amount of correction of the phase difference is also different depending on the F number of the lens. Accordingly, in the present technology, in a case of using an optical system of which the F number is variable, the correction coefficient is adjusted in accordance with the F number.

<Regarding Phase Difference AF Process>

Next, referring to the flowchart of FIG. 27, a description will be given of the phase difference AF process of correcting the phase difference in accordance with the F number. The phase difference AF process shown in FIG. 27 is executed when the camera 500 is activated or when a user operates the control value setting dial 525.

Figure 27:
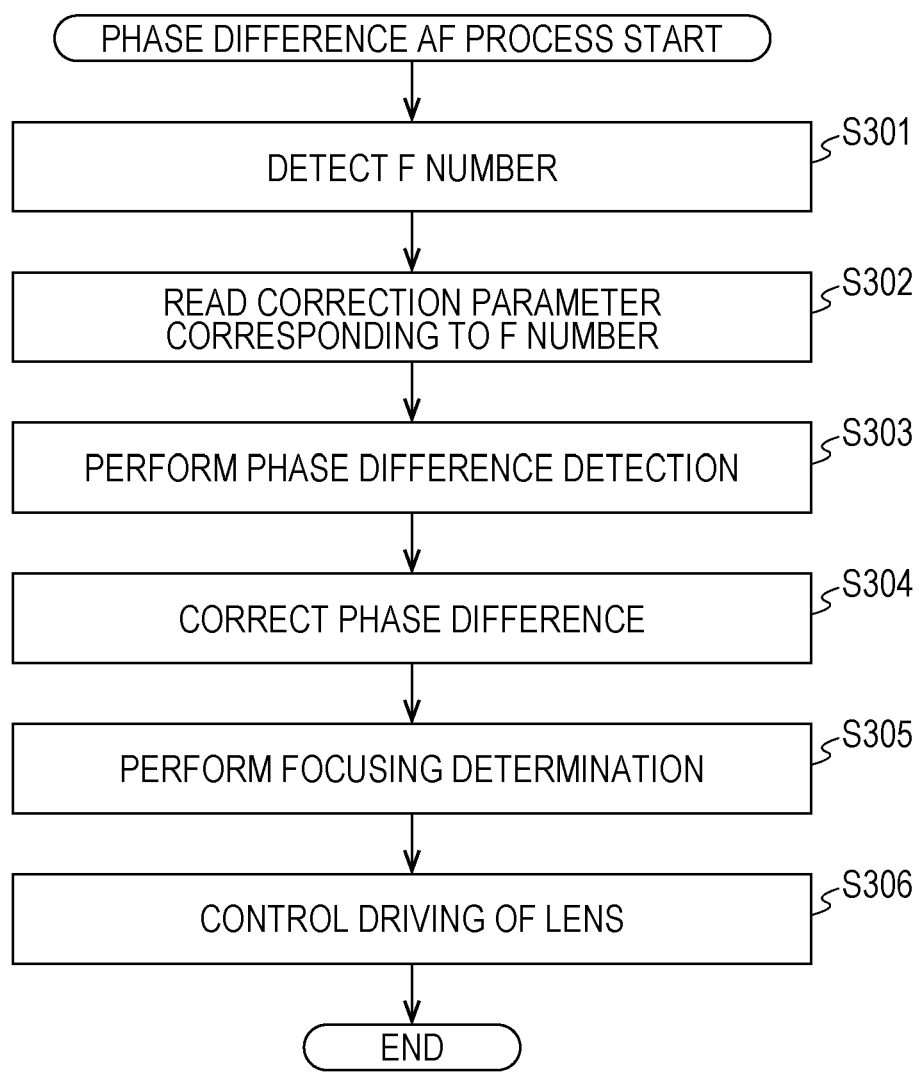
FIG. 27 is a flowchart illustrating the phase difference AF process of the imaging apparatus.

It should be noted that the process in steps S303 to S306 of the flowchart of FIG. 27 is executed in a similar manner to the process in steps S105 to S108 of the flowchart of FIG. 19, and the description thereof will be omitted. Further, in the flowchart of FIG. 27, before the process of step S303, the process that is the same as the process of steps S101 to S103 of the flowchart of FIG. 19 is performed.

Here, it is understood that the slope (correction parameter) for each F number is stored in the memory in advance.

That is, in step S301, the phase difference correction section 309 detects the currently set F number.

In step S302, the phase difference correction section 309 reads the correction parameter for each F number stored in the memory 307.

In such a manner, even when the F number changes, it is possible to appropriately correct the phase difference, and it is possible to prevent the accuracy of AF from being reduced.

<Example of Application to Capsule Endoscope>

Figure 28:
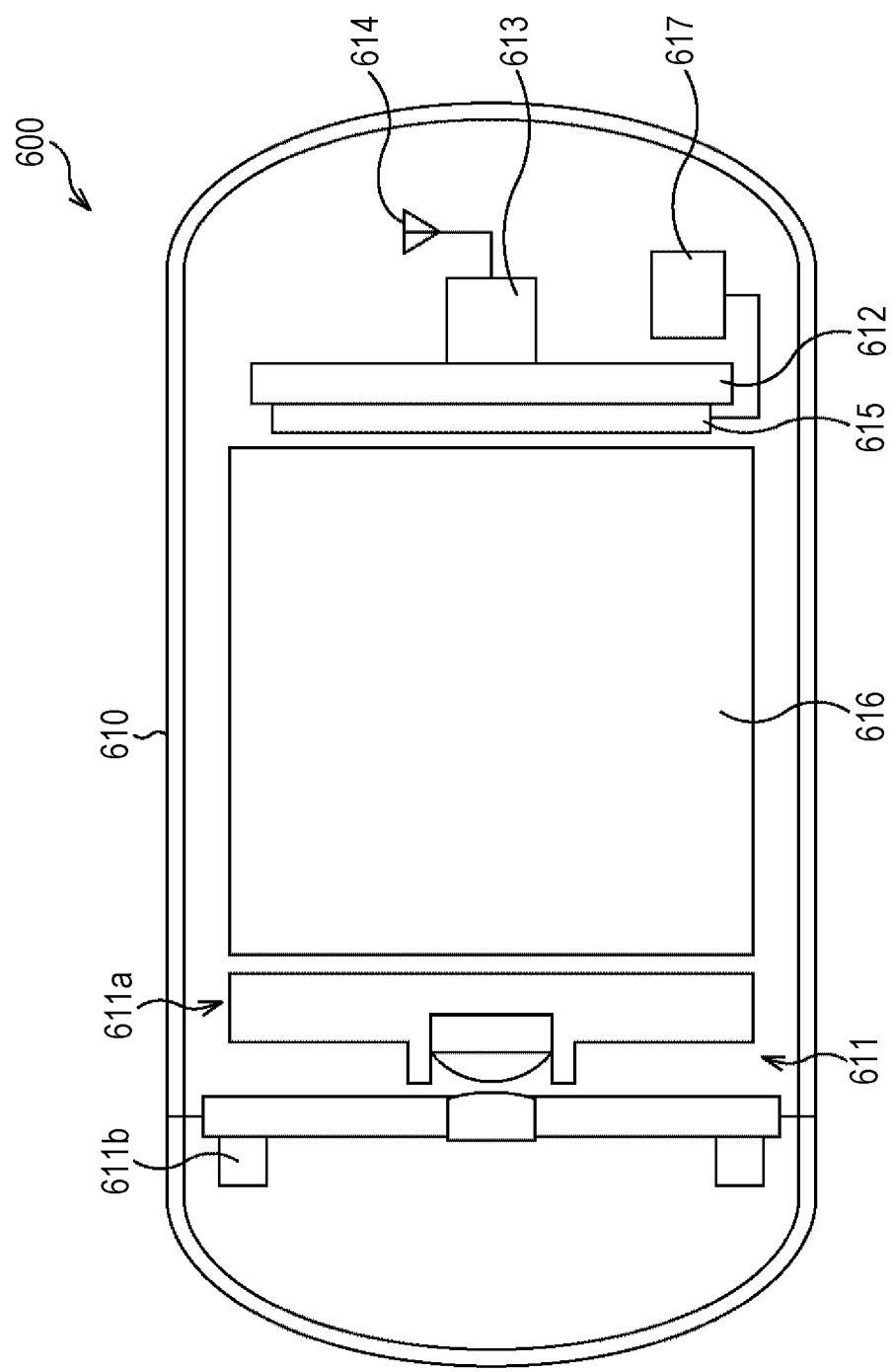
FIG. 28 is a diagram illustrating a configuration of appearance of a capsule endoscope according to the present technology.

FIG. 28 is a diagram illustrating a configuration of a section of the capsule endoscope according to the present technology.

A capsule endoscope 600 includes, in a casing 610 of which both end surfaces are hemispherical and of which the midsection is cylindrical: a camera (ultraminiature camera) 611 that is utilized for photographing an image of a body cavity; a memory 612 that is for storing image data photographed by the camera 611; and a wireless transmitter 613 that transmits the stored image data to the external device through an antenna 614 after the capsule endoscope 600 is excreted from the body of the subject.

Further, in the casing 610, a central processing unit (CPU) 615 and a coil (magnetic-force/current conversion coil) 616 are provided.

The CPU 615 controls a photography operation performed by the camera 611, an operation of storing data in the memory 612, and controls data transmission, which is performed by the wireless transmitter 613, from the memory 612 to a data reception apparatus (not shown in the drawing) outside the casing 610. The coil 616 supplies electric power to the camera 611, the memory 612, the wireless transmitter 613, the antenna 614, and a light source 611b to be described later.

Furthermore, in the casing 610, when the capsule endoscope 600 is set in the data reception apparatus, a magnetic (reed) switch 617 that is used for detecting that the capsule endoscope 600 is set in the data reception apparatus. The CPU 615 supplies electric power from the coil 616 to the wireless transmitter 613 at the time point when the reed switch 617 detects that the capsule endoscope 600 is placed into the data reception apparatus and is able to transmit the data.

The camera 611 has, for example, an imaging device 611a that includes an objective optical system to photograph an image of the inside of the body cavity, and a plurality of (here two) light sources 611b that illuminates the inside of the body cavity. Specifically, the camera 611 includes a complementary metal oxide semiconductor (CMOS) sensor having, for example, a light emitting diode (LED) as a light source 611b, a charge coupled device (CCD), and the like.

Further, the camera 611 has a configuration and functions similarly to that of the electronic apparatus 300 of FIG. 17.

However, when the phase difference is intended to be detected, for example, in the process of recognizing the focal deviation, blurring of the edge portion of the object is detected as information of the phase difference, and thus the information of the edge portion of the object becomes indispensable.

However, when the image of the inside of the body cavity is photographed by the capsule endoscope 600, there are a few edge portions on the surfaces of human organs when used as an object, and thus it is difficult to appropriately detect the phase difference.

Figure 29:
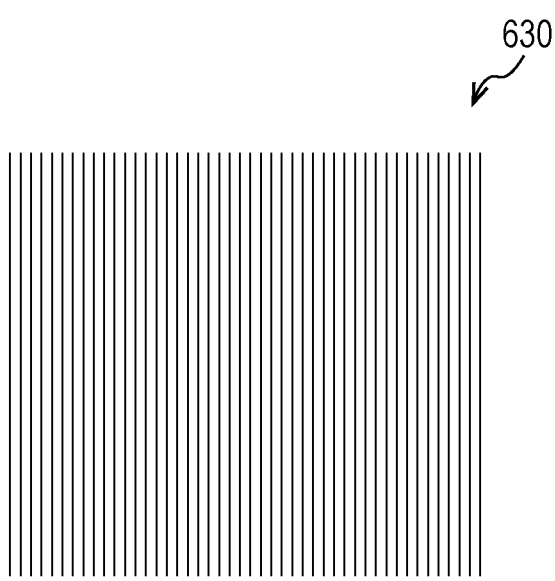
FIG. 29 is a diagram illustrating an example of a pattern of light which is emitted by a light source.

Accordingly, the light source 611b emits light with a specific pattern. Specifically, the light source 611b emits light 630 with a pattern including edges as shown in FIG. 29. The wavelength of the light emitted by the light source 611b is arbitrarily set, but for example, the light of the light source 611b may be light with a short wavelength (for example, 450 nm) in order to separate the light from the color of the organ in which the red color is relatively dominant, and may be light (for example, infrared light) other than the visible light so as not to interfere with the photographing of the object. In this case, in the phase difference detection pixel, the color filter 124 is formed to be compliant for light other than the visible light.

<Regarding Endoscope Photography Process>

Next, referring to the flowchart of FIG. 30, the photography process performed by the capsule endoscope 600 will be described. The endoscope photography process shown in FIG. 30 starts when the capsule endoscope 600 reaches the object (organ) as a photographing target in the body cavity.

Figure 30:
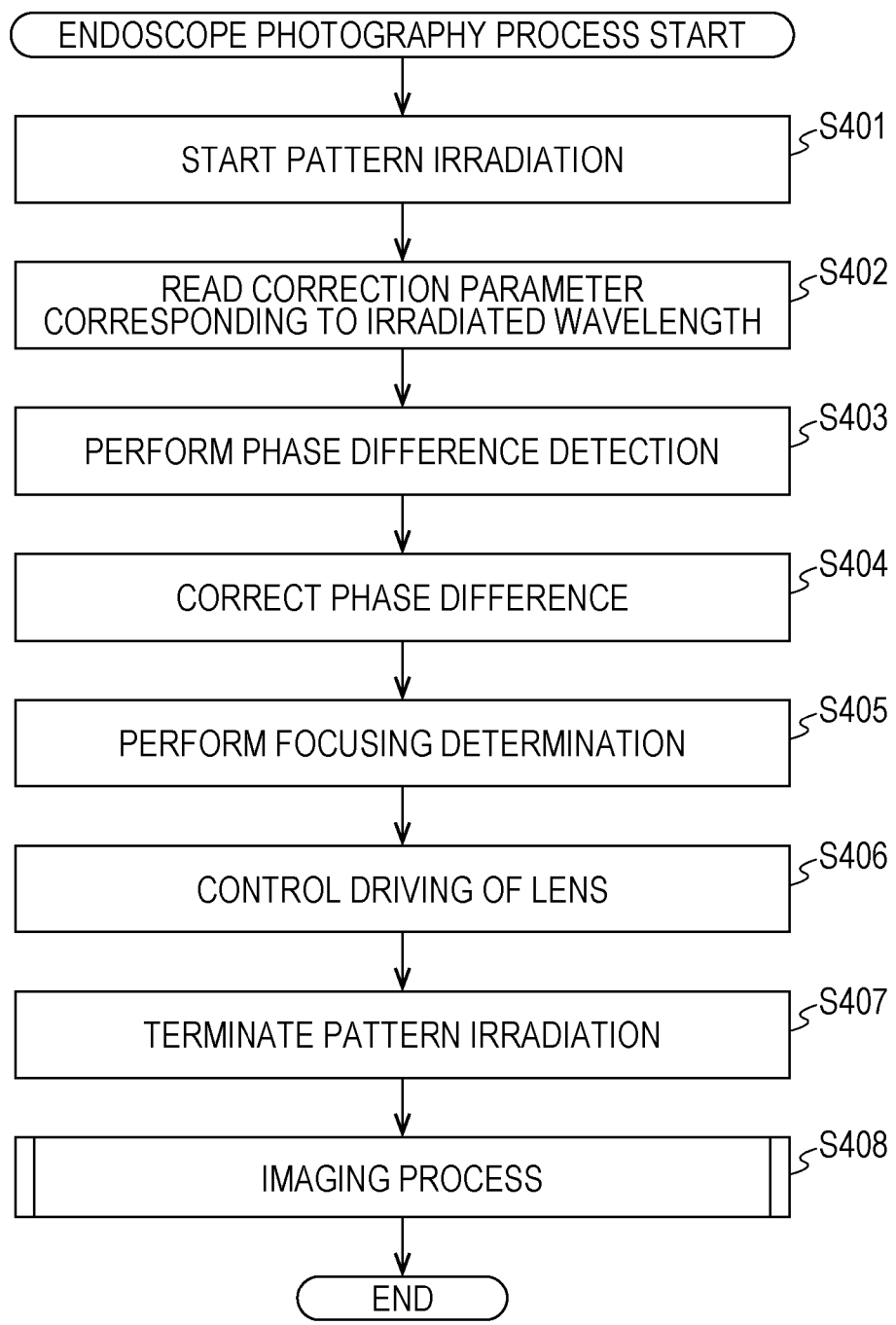
FIG. 30 is a flowchart illustrating a photography process of the capsule endoscope.

It should be noted that the process in steps S403 to S406 of the flowchart of FIG. 30 is executed in a similar manner to the process in steps S105 to S108 of the flowchart of FIG. 19, and the description thereof will be omitted. Further, in the flowchart of FIG. 30, before the process of step S403, the process that is the same as the process of steps S101 to S103 of the flowchart of FIG. 19 is performed.

Here, it is understood that the slope (correction parameter) for each wavelength is stored in the memory in advance.

That is, in step S401, the light source 611b starts emitting the light of the specific pattern.

In step S402, the phase difference correction section 309 reads the correction parameter for each wavelength stored in the memory 307.

In such a manner, in accordance with the wavelength of the emitted light, it is possible to appropriately correct the phase difference.

In step S407, the emission of the light with the specific pattern performed by the light source 611b is terminated to prevent the light from affecting the image.

Then, in step S408, the imaging process described with reference to the flowchart of FIG. 22 is performed.

According to the above-mentioned process, even in the body cavity in which there are a few edge portions, it is possible to appropriately correct the phase difference, and further it is possible to prevent the accuracy of AF from being reduced. As a result, it is possible to further accurately observe shapes of the organs and arrangement of blood vessels in a body cavity.

In the above description, in the capsule endoscope, the configuration, in which the phase difference is corrected in accordance with the wavelength of the light source, has been applied. However, in a compact digital camera, a digital single-lens reflex camera, and a general camera such as a smartphone having an imaging function, the phase difference may be corrected in accordance with a photography environment such as the wavelength of the light source and the color of the object.

Further, the phase difference may not be uniformly corrected for the full angle of view, but the phase difference may be corrected for each position in the imaging region (angle of view) in accordance with the wavelength of the light source and the color of the object.

Even here, the correction parameters used in correction of the phase difference are obtained from the above-mentioned phase difference characteristics. For example, the phase difference characteristics in a case where the color temperature is set to 3000 K and the phase difference characteristics in a case where the color temperature is set to 6000 K are stored in the memory in advance. In a case where the color temperature detected in actual photography is 4500 K, by using an intermediate value between the correction parameter of the color temperature 3000 K and the correction parameter of the color temperature 6000 K stored in the memory, the phase difference correction is performed.

<Application to Imaging Module>

According to the present technology, for example, at the time of manufacturing an imaging module in which lenses, optical filters such as the IR cut filter (IRCF), the imaging device, and the like are integrated, the correction of the phase difference characteristics, which are obtained from the outputs of the monitoring pixels and in which deviation occurs, can be improved by the correction of the optical characteristics of the imaging module.

For example, due to the manufacturing variations of the imaging device, the phase difference characteristics shown in FIG. 6 are obtained.

Figure 31:
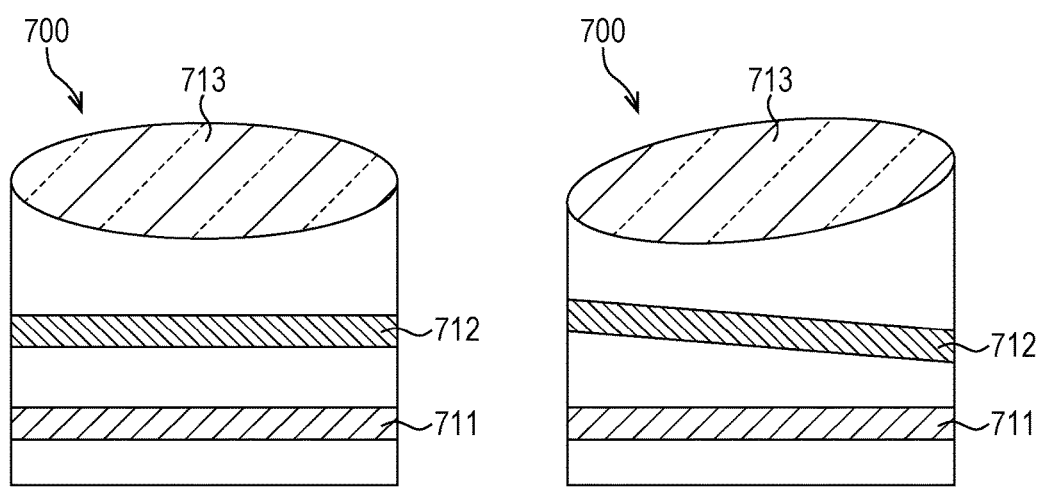
FIG. 31 is a diagram illustrating a configuration example of an imaging module.

Here, in the imaging module 700 shown on the left side of FIG. 31, when an imaging device 711, an optical filter 712, and a lens 713 are formed without deviation as designed, the phase difference characteristics of the imaging module 700 may also have variations.

Therefore, in the present technology, and in accordance with the phase difference characteristics, by forming the optical filter 712 and the lens 713, the phase difference characteristics of the imaging module 700 are corrected. Specifically, as shown in the right side of FIG. 31, by tilting the optical filter 712 or the lens 713 or newly inserting for example a polarization filter as the optical filter 712, the phase difference characteristics of the imaging module 700 are corrected.

As described above, according to the present technology, it is possible to correct deviation in the phase difference characteristics caused by variations of the imaging device, at the time of manufacturing the imaging module. That is, even when it is difficult to sufficiently suppress normal variations since the imaging device is miniaturized, the correction is not limited to correction in the signal process, and it is possible to obtain desired characteristics through optical correction.

In the above description, each difference between a pair of phase difference detection pixels is used in the phase difference detection. However, for example, as disclosed in Japanese Unexamined Patent Application Publication No. 2013-42379, the difference may be used in a depth detection.

Figure 32:
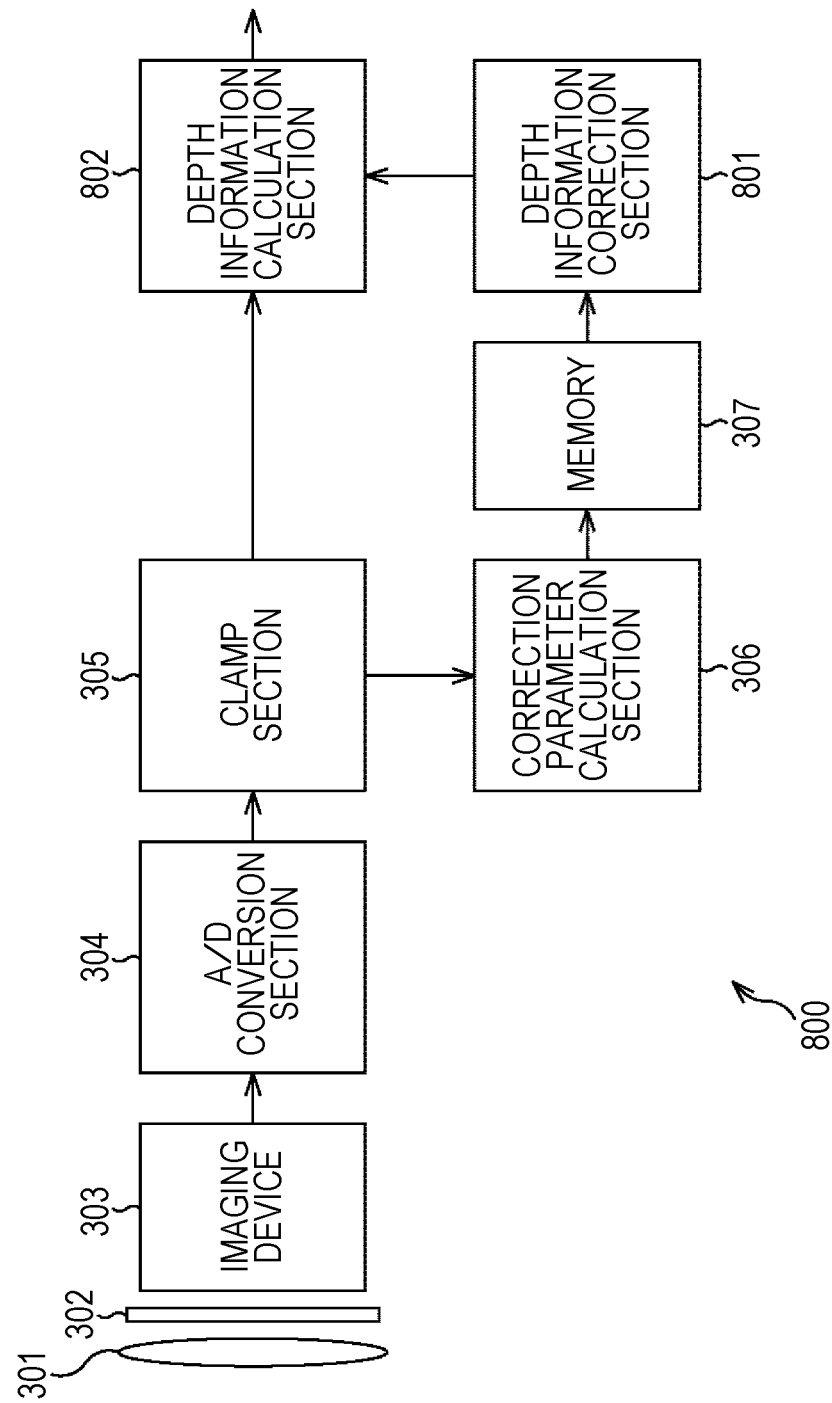
FIG. 32 is a block diagram illustrating a configuration example of a 3D sensor according to the present technology.

Specifically, in a 3D sensor 800 shown in FIG. 32, a depth information correction section 801 corrects depth information, which indicates an object-side depth (distance) calculated on the basis of each difference of the phase difference detection pixels by a depth information calculation section 802, by using the correction parameter stored in the memory 307. Thereby, when a stereoscopic image is generated, by using the correction parameters obtained on the basis of the monitoring pixels, it is possible to correct the depth information and to further reliably generate the stereoscopic image.

Further, embodiments of the present technology are not limited to the above-mentioned embodiments, and may be modified into various forms without departing from the scope of the present technology.

Furthermore the present technology may adopt the following configurations.

(1) A solid-state imaging device including: a plurality of pixels that includes phase difference detection pixels for performing auto focus (AF) through phase difference detection, in which each phase difference detection pixel includes an on-chip lens, and a photoelectric conversion section that is formed on a lower layer than the on-chip lens, and in which in a plurality of predetermined phase difference detection pixels among the phase difference detection pixels, the on-chip lenses are formed to have amounts of deviation different from amounts of exit pupil correction corresponding to arrangement of the predetermined phase difference detection pixels.

(2) The solid-state imaging device according to (1), in which the phase difference detection pixel further includes a light blocking film which blocks light from reaching a part of the photoelectric conversion section, and in which in the predetermined phase difference detection pixels, the on-chip lenses and the light blocking film are formed to have amounts of deviation different from the amounts of exit pupil correction corresponding to the arrangement of the predetermined phase difference detection pixels.

(3) The solid-state imaging device according to (2), in which the predetermined phase difference detection pixels are arranged to be close to each other, and in which in the predetermined phase difference detection pixels, the on-chip lenses and the light blocking film are subjected to exit pupil correction based on amounts of correction different from the amount of exit pupil correction corresponding to the arrangement of the phase difference detection pixels.

(4) The solid-state imaging device according to (2), in which the predetermined phase difference detection pixels are arranged to be far from each other, and in which in the predetermined phase difference detection pixels, the on-chip lenses and the light blocking film are not subjected to exit pupil correction.

(5) The solid-state imaging device according to (2) or (4), in which the predetermined phase difference detection pixels are disposed outside an image output region where imaging pixels which are included in the plurality of pixels and are for generating an image are disposed.

(6) The solid-state imaging device according to (2) or (4), in which the predetermined phase difference detection pixels are disposed inside an image output region where imaging pixels which are included in the plurality of pixels and are for generating an image are disposed.

(7) The solid-state imaging device according to (2), in which the pixels adjacent to the predetermined phase difference detection pixels have the on-chip lenses with a larger size than a normal size.

(8) The solid-state imaging device according to (2), in which the pixels adjacent to the predetermined phase difference detection pixels have the on-chip lenses with a smaller size than a normal size.

(9) The solid-state imaging device according to (1), in which the phase difference detection pixels have photoelectric conversion sections which are separately formed as the photoelectric conversion section.

(10) The solid-state imaging device according to (1) to (9), further including: a phase difference detection section that performs phase difference detection by using differences between outputs of the phase difference detection pixels; and a phase difference correction section that corrects detected phase differences by using the outputs of the predetermined phase difference detection pixels which are obtained in advance.

(11) The solid-state imaging device according to (10), in which the phase difference correction section corrects the detected phase differences, on the basis of phase difference characteristics obtained by using the outputs of the predetermined phase difference detection pixels which are obtained in advance.

(12) The solid-state imaging device according to (11), in which in a pair of the phase difference detection pixels, the phase difference characteristics indicate respective outputs of the phase difference detection pixels at an angle of an optical axis of incident light, and in which the phase difference correction section corrects the detected phase difference by using a correction parameter which is obtained using slopes of the outputs in a predetermined angular range of the phase difference characteristics.

(13) The solid-state imaging device according to (12), in which the phase difference correction section corrects the detected phase difference by using the correction parameter corresponding to an F number of the lens.

(14) The solid-state imaging device according to (12), in which the phase difference correction section corrects the detected phase difference by using the correction parameter corresponding to an image height.

(15) The solid-state imaging device according to (12), in which the phase difference correction section corrects the detected phase difference by using the correction parameter corresponding to a photography environment.

(16) An electronic apparatus including: an imaging device that has a plurality of pixels including phase difference detection pixels for performing auto focus (AF) through phase difference detection, where each phase difference detection pixel includes an on-chip lens, a photoelectric conversion section that is formed on a lower layer than the on-chip lens, and a light blocking film which blocks light from reaching a part of the photoelectric conversion section, and where in a plurality of predetermined phase difference detection pixels among the phase difference detection pixels, the on-chip lenses and the light blocking film are formed to have amounts of deviation different from amounts of exit pupil correction corresponding to arrangement of the predetermined phase difference detection pixels; a lens that causes object light to be incident onto the imaging device; a phase difference detection section that performs phase difference detection by using differences between outputs of the phase difference detection pixels; a phase difference correction section that corrects detected phase differences by using outputs of the predetermined phase difference detection pixels which are obtained in advance; and a lens control section that controls driving of the lens in accordance with the corrected phase differences.

(17) The electronic apparatus according to (16), further including a light source that emits light with a specific pattern, in which the phase difference correction section corrects the detected phase difference by using the correction parameter corresponding to a wavelength of the light source.

(18) The electronic apparatus according to (16), in which the phase difference detection pixels are disposed inside an image output region where imaging pixels which are included in the plurality of pixels and are utilized to generate an image are disposed, and in which the electronic apparatus further includes a defect correction section that corrects outputs of the predetermined phase difference detection pixels by using the outputs of the predetermined phase difference detection pixels obtained in advance.

(19) A lens control method for an electronic apparatus including an imaging device that has a plurality of pixels including phase difference detection pixels for performing auto focus (AF) through phase difference detection, where each phase difference detection pixel includes an on-chip lens, a photoelectric conversion section that is formed on a lower layer than the on-chip lens, and a light blocking film which blocks light from reaching a part of the photoelectric conversion section, and where in a plurality of predetermined phase difference detection pixels among the phase difference detection pixels, the on-chip lenses and the light blocking film are formed to have amounts of deviation different from amounts of exit pupil correction corresponding to arrangement of the predetermined phase difference detection pixels, and a lens that causes object light to be incident onto the imaging device, the lens control method for the electronic apparatus including: performing phase difference detection by using differences between outputs of the phase difference detection pixels; correcting detected phase differences by using outputs of the predetermined phase difference detection pixels which are obtained in advance; and controlling driving of the lens in accordance with the corrected phase differences.

(20) An imaging module including: an imaging device that has a plurality of pixels including phase difference detection pixels for performing auto focus (AF) through phase difference detection, where each phase difference detection pixel includes an on-chip lens, a photoelectric conversion section that is formed on a lower layer than the on-chip lens, and a light blocking film which blocks light from reaching a part of the photoelectric conversion section, and where in a plurality of predetermined phase difference detection pixels among the phase difference detection pixels, the on-chip lenses and the light blocking film are formed to have amounts of deviation different from amounts of exit pupil correction corresponding to arrangement of the predetermined phase difference detection pixels; a lens that causes object light to be incident onto the imaging device; and an optical filter that is formed between the imaging device and the lens, in which the lens and the optical filter are formed in accordance with phase difference characteristics obtained by using outputs of the predetermined phase difference detection pixels which are obtained in advance.

(21) A solid-state imaging device, comprising:
a pixel region including a plurality of pixels arranged in a two-dimensional matrix pattern,
wherein at least some of the plurality of pixels are phase difference detection pixels that include a photoelectric conversion section disposed on a semiconductor substrate and a light blocking film disposed above a portion of the photoelectric conversion section, and
wherein a location of the light blocking film for a phase difference detection pixel positioned at a periphery of the pixel region is different from a location of the light blocking film for a phase difference detection pixel positioned in a center portion of the pixel region.

(22) The solid-state imaging device according to (21), wherein each of the phase difference detection pixels include an on-chip lens disposed above the light blocking film.

(23) The solid-state imaging device according to (22), wherein the phase difference detection pixels are disposed in a non-imaging region of the pixel region.

(24) The solid-state imaging device according to (22), wherein the on-chip lenses and the light blocking film for some of the phase difference detection pixels are not subjected to exit pupil correction, and
wherein the on-chip lenses for some of the plurality of pixels other than the phase difference detection pixels are subjected to exit pupil correction.

(25) The solid-state imaging device according to (22), wherein the on-chip lenses and the light blocking film for the phase difference detection pixels are subjected to exit pupil correction.

(26) The solid-state imaging device according to (22), wherein a light blocking film of a first phase difference detection pixel is arranged to block light at a left side of the first phase different detection pixel and a light blocking film of a second phase difference detection pixel is arranged to block light at a right side of the second phase difference detection pixel.

(27) The solid-state imaging device according to (22), wherein an amount of exit pupil correction corresponding to a lens of a pixel in a first location is different than an amount of exit pupil correction applied to a lens of a phase difference detection pixel in the first location.

(28) The solid-state imaging device according to (22), wherein groups of the phase difference detection pixels are located in one or more non-imaging regions located at a side of the pixel region.

(29) The solid-state imaging device according to (21), wherein at least one phase difference detection pixel has a plurality of photoelectric conversion sections.

(30) The solid-state imaging device according to (21), wherein the center portion comprises a center portion located at a periphery of the pixel region.

(31) The solid-state imaging device according to (21), wherein the center portion comprises a center portion located at a central portion of the pixel region.

(32) An electronic apparatus comprising:
a lens; and
a solid-state imaging device, including:
a pixel region including a plurality of pixels arranged in a two-dimensional matrix pattern,
wherein at least some of the plurality of pixels are phase difference detection pixels that include a photoelectric conversion section disposed on a semiconductor substrate and a light blocking film disposed above a portion of the photoelectric conversion section, and
wherein a location of the light blocking film for a phase difference detection pixel positioned at a periphery of the pixel region is different than a location of the light blocking film for a phase difference detection pixel positioned in a center portion of the pixel region.

(33) The electronic apparatus according to Claim 12, wherein each of the phase difference detection pixels include an on-chip lens disposed above the light blocking film.

(34) The electronic apparatus according to Claim 13, wherein the phase difference detection pixels are disposed in a non-imaging region of the pixel region.

(35) The electronic apparatus according to Claim 13, wherein the on-chip lenses and the light blocking film for some of the phase difference detection pixels are not subjected to exit pupil correction, and
wherein the on-chip lenses for some of the plurality of pixels other than the phase difference detection pixels are subjected to exit pupil correction.

(36) The electronic apparatus according to Claim 13, wherein the on-chip lenses and the light blocking film for the phase difference detection pixels are subjected to exit pupil correction.

(37) The electronic apparatus according to Claim 13, wherein a light blocking film of a first phase difference detection pixel is arranged to block light at a left side of the first phase different detection pixel and a light blocking film of a second phase difference detection pixel is arranged to block light at a right side of the second phase difference detection pixel.

(38) The electronic apparatus according to Claim 13, wherein an amount of exit pupil correction corresponding to a lens of a pixel in a first location is different than an amount of exit pupil correction applied to a lens of a phase difference detection pixel in the first location.

(39) The electronic apparatus according to Claim 13, wherein groups of the phase difference detection pixels are located in one or more non-imaging regions located at a side of the pixel region.

(40) The electronic apparatus according to Claim 12, wherein at least one phase difference detection pixel has a plurality of photoelectric conversion sections.

(41) The electronic apparatus according to Claim 12, wherein the center portion comprises a center portion located at a periphery of the pixel region.

(42) The electronic apparatus according to Claim 12, wherein the center portion comprises a center portion located at a central portion of the pixel region.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

122 Photodiode
123 Light blocking film
125 On-chip lens
300 Electronic apparatus
301 Lens
303 Imaging device
307 Memory
308 Phase difference detection section
309 Phase difference correction section
310 Lens control section
311 Defect correction section
400 Electronic apparatus
500 Camera
600 Capsule endoscope
700 Imaging module
800 3D sensor

The invention claimed is:

1. A solid-state imaging device, comprising:
a plurality of pixels that include a plurality of phase difference detection pixels configured to execute auto focus (AF) based on phase difference detection, wherein each phase difference detection pixel of the plurality of phase difference detection pixels includes:
an on-chip lens, and
a photoelectric conversion section below the on-chip lens,
wherein an optical center of the on-chip lens of each of a plurality of determined phase difference detection pixels of the plurality of phase difference detection pixels deviates from a center of the photoelectric conversion section of each of the plurality of determined phase difference detection pixels,
wherein an amount of the deviation of the optical center of the on-chip lens from the center of the photoelectric conversion section is different from an amount of expected deviation corresponding to an arrangement of the plurality of determined phase difference detection pixels, and wherein the amount of expected deviation is due to exit pupil correction of the on-chip lens.

2. The solid-state imaging device according to claim 1, wherein each of the plurality of phase difference detection pixels further includes a light blocking film configured to block light from a part of the photoelectric conversion section,
wherein the optical center of the on-chip lens of each of the plurality of determined phase difference detection pixels deviates from a position of the light blocking film, and
wherein an amount of the deviation of the optical center of the on-chip lens from the position of the light blocking film is different from the amount of the expected deviation corresponding to the arrangement of the plurality of determined phase difference detection pixels.

3. The solid-state imaging device according to claim 2, wherein the plurality of pixels further comprises a plurality of imaging pixels in an image output region, wherein the plurality of imaging pixels is configured to generate an image, and
wherein the plurality of determined phase difference detection pixels is in a region that is outside the image output region.

4. The solid-state imaging device according to claim 2, wherein the plurality of pixels further comprises a plurality of imaging pixels in an image output region, wherein the plurality of imaging pixels is configured to generate an image, and
wherein the plurality of determined phase difference detection pixels is inside the image output region.

5. The solid-state imaging device according to claim 2, wherein a size of the on-chip lens of at least one phase difference detection pixel of the plurality of phase difference detection pixels adjacent to the plurality of determined phase difference detection pixels is larger than a size of the on-chip lens of at least one phase difference detection pixel of the plurality of determined phase difference detection pixels.

6. The solid-state imaging device according to claim 2, wherein a size of the on-chip lens of at least one phase difference detection pixel of the plurality of phase difference detection pixels adjacent to the plurality of determined phase difference detection pixels is smaller than a size of the on-chip lens of at least one phase difference detection pixel of the plurality of determined phase difference detection pixels.

7. The solid-state imaging device according to claim 1, wherein the photoelectric conversion section comprises a first photoelectric conversion section and a second photoelectric conversion section, and wherein the first photoelectric conversion section is separate from the second photoelectric conversion section.

8. The solid-state imaging device according to claim 1, further comprising:
a phase difference detection section configured to determine phase differences based on differences between outputs of the plurality of phase difference detection pixels; and
a phase difference correction section configured to correct the determined phase differences based on outputs of the plurality of determined phase difference detection pixels.

9. The solid-state imaging device according to claim 8, wherein the phase difference correction section is further configured to correct the determined phase differences based on phase difference characteristics, and wherein the phase difference characteristics are based on the outputs of the plurality of determined phase difference detection pixels.

10. The solid-state imaging device according to claim 9, wherein, in a pair of phase difference detection pixels of the plurality of determined phase difference detection pixels, the phase difference characteristics indicate respective outputs of phase difference detection pixels of the pair of phase difference detection pixels at an angle of an optical axis of incident light, wherein the phase difference correction section is further configured to correct the determined phase differences based on a correction parameter, and wherein the correction parameter is based on slopes of the respective outputs of the phase difference detection pixels of the pair of phase difference detection pixels in a determined angular range of the phase difference characteristics.

11. The solid-state imaging device according to claim 10, wherein the phase difference correction section is further configured to correct the determined phase differences based on the correction parameter that corresponds to an F number of an imaging lens.

12. The solid-state imaging device according to claim 10, wherein the phase difference correction section is further configured to correct the determined phase differences based on the correction parameter that corresponds to an image height.

13. The solid-state imaging device according to claim 10, wherein the phase difference correction section is further configured to correct the determined phase differences based on the correction parameter that corresponds to a photography environment.

14. An electronic apparatus, comprising:
an imaging device that comprises a plurality of pixels, wherein the plurality of pixels includes a plurality of phase difference detection pixels configured to execute auto focus (AF) based on phase difference detection,
wherein each phase difference detection pixel of the plurality of phase difference detection pixels includes:
an on-chip lens,
a photoelectric conversion section below the on-chip lens, and
a light blocking film configured to block light from a part of the photoelectric conversion section,
wherein an optical center of the on-chip lens of each of a plurality of determined phase difference detection pixels of the plurality of phase difference detection pixels deviates from a center of the photoelectric conversion section of each of the plurality of determined phase difference detection pixels,
wherein an amount of the deviation of the optical center of the on-chip lens from the center of the photoelectric conversion section is different from an amount of expected deviation corresponding to an arrangement of the plurality of determined phase difference detection pixels, and wherein the amount of expected deviation is due to exit pupil correction of the on-chip lens;
a lens configured to cause object light to be incident onto the imaging device;
a phase difference detection section configured to determine phase differences based on differences between outputs of the plurality of phase difference detection pixels;
a phase difference correction section configured to correct the determined phase differences based on outputs of the plurality of determined phase difference detection pixels; and
a lens control section configured to control drive of the lens based on the corrected phase differences.

15. The electronic apparatus according to claim 14, further comprising a light source configured to emit light with a specific pattern, wherein the phase difference correction section is further configured to correct the determined phase differences based on a correction parameter corresponding to a wavelength of the emitted light.

16. The electronic apparatus according to claim 14, wherein the plurality of pixels further comprises a plurality of imaging pixels in an image output region, wherein the plurality of imaging pixels is configured to generate an image,
wherein the plurality of phase difference detection pixels are inside the image output region, and
wherein the electronic apparatus further comprises a defect correction section configured to correct the outputs of the plurality of phase difference detection pixels based on the outputs of the plurality of determined phase difference detection pixels.

17. A lens control method, comprising:
in an electronic apparatus that includes an imaging device, wherein the imaging device comprises a plurality of pixels, wherein the plurality of pixels comprises a plurality of phase difference detection pixels configured to execute auto focus (AF) based on phase difference detection, wherein each phase difference detection pixel of the plurality of phase difference detection pixels includes an on-chip lens, a photoelectric conversion section below the on-chip lens, and a light blocking film configured to block light from a part of the photoelectric conversion section, wherein an optical center of the on-chip lens of each of a plurality of determined phase difference detection pixels of the plurality of phase difference detection pixels deviates from a center of the photoelectric conversion section of each of the plurality of determined phase difference detection pixels, wherein an amount of the deviation of the optical center of the on-chip lens from the center of the photoelectric conversion section is different from an amount of expected deviation corresponding to an arrangement of the plurality of determined phase difference detection pixels, and wherein the amount of expected deviation is due to exit pupil correction of the on-chip lens, and a lens configured to cause object light to be incident onto the imaging device:
determining phase differences based on differences between outputs of the plurality of phase difference detection pixels;
correcting the determined phase differences based on outputs of the plurality of determined phase difference detection pixels; and
controlling driving of the lens based on the corrected phase differences.

18. An imaging module, comprising:
an imaging device that comprises a plurality of pixels, wherein the plurality of pixels include a plurality of phase difference detection pixels configured to execute auto focus (AF) based on phase difference detection, wherein each phase difference detection pixel of the plurality of phase difference detection pixels includes:
an on-chip lens,
a photoelectric conversion section below the on-chip lens, and
a light blocking film configured to block light from a part of the photoelectric conversion section,
wherein an optical center of the on-chip lens of each of a plurality of determined phase difference detection pixels of the plurality of the phase difference detection pixels deviates from a center of the photoelectric conversion section of each of the plurality of determined phase difference detection pixels,
wherein an amount of the deviation of the optical center of the on-chip lens from the center of the photoelectric conversion section is different from an amount of expected deviation corresponding to an arrangement of the plurality of determined phase difference detection pixels, and wherein the amount of expected deviation is due to exit pupil correction of the on-chip lens;
a lens configured to cause object light to be incident onto the imaging device; and
an optical filter between the imaging device and the lens, wherein the lens and the optical filter are arranged based on phase difference characteristics, and wherein the phase difference characteristics are based on outputs of the plurality of determined phase difference detection pixels.

19. A solid-state imaging device, comprising:
a pixel region that comprises a plurality of pixels arranged in a two-dimensional matrix pattern, wherein the plurality of pixels comprises a plurality of phase difference detection pixels, wherein each of the plurality of phase difference detection pixels includes a photoelectric conversion section on a semiconductor substrate and a light blocking film above a portion of the photoelectric conversion section, and
wherein a location of the light blocking film of a first phase difference detection pixel of the plurality of phase difference detection pixels with respect to the photoelectric conversion section of the first phase difference detection pixel is different from a location of the light blocking film of a second phase difference detection pixel of the plurality of phase difference detection pixels with respect to the photoelectric conversion section of the second phase difference detection pixel,
wherein the first phase difference detection pixel is at a periphery of the pixel region and the second phase difference detection pixel is in a center portion of the pixel region,
wherein each of the plurality of phase difference detection pixels includes an on-chip lens above the light blocking film, and
wherein an amount of deviation of an optical center of the on-chip lens of at least one pixel of the plurality of pixels from a center of a photoelectric conversion section of the pixel is different from an amount of deviation of an optical center of the on-chip lens of a third phase difference detection pixel of the plurality of phase difference detection pixels from a center of the photoelectric conversion section of the third phase difference detection pixel.

20. The solid-state imaging device according to claim 19, wherein the plurality of phase difference detection pixels are in a non-imaging region of the pixel region.

21. The solid-state imaging device according to claim 19, wherein an optical center of the on-chip lens of at least one phase difference detection pixel of the plurality of phase difference detection pixels and a location of the light blocking film of the at least one phase difference detection pixel are not deviated from a center of the photoelectric conversion section of the at least one phase difference detection pixel, and
wherein the optical center of an on-chip lens of the at least one pixel of the plurality of pixels different from the plurality of phase difference detection pixels deviates from a center of a photoelectric conversion section of the at least one pixel.

22. The solid-state imaging device according to claim 19, wherein an optical center of the on-chip lens of each of the plurality of phase difference detection pixels and a location of the light blocking film of each of the plurality of phase difference detection pixels deviates from a center of the photoelectric conversion section of each of the plurality of phase difference detection pixels.

23. The solid-state imaging device according to claim 19, wherein the light blocking film of a third phase difference detection pixel of the plurality of phase difference detection pixels is configured to block light at a first side of the third phase different detection pixel and the light blocking film of a fourth phase difference detection pixel of the plurality of phase difference detection pixels is configured to block light at a second side of the fourth phase difference detection pixel, and wherein the first side is opposite to the second side.

24. The solid-state imaging device according to claim 19, wherein the pixel and the third phase difference detection pixel are in a specific location.

25. The solid-state imaging device according to claim 19, wherein groups of phase difference detection pixels of the plurality of phase difference detection pixels are located in at least one non-imaging region located at a side of the pixel region.

26. The solid-state imaging device according to claim 19, wherein at least one phase difference detection pixel of the plurality of phase difference detection pixels has a plurality of photoelectric conversion sections.

27. The solid-state imaging device according to claim 19, wherein the center portion of the pixel region comprises a center portion of the periphery of the pixel region.

28. An electronic apparatus, comprising:
a lens; and
a solid-state imaging device that comprises:
a pixel region that includes a plurality of pixels arranged in a two-dimensional matrix pattern,
wherein the plurality of pixels comprises a plurality of phase difference detection pixels, wherein each of the plurality of phase difference detection pixels includes a photoelectric conversion section on a semiconductor substrate and a light blocking film above a portion of the photoelectric conversion section, and
wherein a location of the light blocking film of a first phase difference detection pixel of the plurality of phase difference detection pixels with respect to the photoelectric conversion section of the first phase difference detection pixel is different from a location of the light blocking film of a second phase difference detection pixel of the plurality of phase difference detection pixels with respect to the photoelectric conversion section of the second phase difference detection pixel,
wherein the first phase difference detection pixel is at a periphery of the pixel region and the second phase difference detection pixel is in a center portion of the pixel region,
wherein each of the plurality of phase difference detection pixels includes an on-chip lens above the light blocking film, and
wherein an amount of deviation of an optical center of the on-chip lens of at least one pixel of the plurality of pixels from a center of a photoelectric conversion section of the pixel is different from an amount of deviation of an optical center of the on-chip lens of a third phase difference detection pixel of the plurality of phase difference detection pixels from a center of the photoelectric conversion section of the third phase difference detection pixel.

29. The electronic apparatus according to claim 28, wherein the plurality of phase difference detection pixels are in a non-imaging region of the pixel region.

30. The electronic apparatus according to claim 28,
wherein an optical center of the on-chip lens of at least one phase difference detection pixel of the plurality of phase difference detection pixels and a location of the light blocking film of the at least one phase difference detection pixel are not deviated from a center of the photoelectric conversion section of the at least one phase difference detection pixel, and
wherein the optical center of the on-chip lens of the at least one pixel of the plurality of pixels that is different from the plurality of phase difference detection pixels deviates from a center of a photoelectric conversion section of the at least one pixel.

31. The electronic apparatus according to claim 28, wherein an optical center of the on-chip lens of each of the plurality of phase difference detection pixels and a location of the light blocking film of each of the plurality of phase difference detection pixels deviates from a center of the photoelectric conversion section of each of the plurality of phase difference detection pixels.

32. The electronic apparatus according to claim 28, wherein the light blocking film of a third phase difference detection pixel of the plurality of phase difference detection pixels is configured to block light at a first side of the third phase different detection pixel and the light blocking film of a fourth phase difference detection pixel of the plurality of phase difference detection pixels is configured to block light at a second side of the fourth phase difference detection pixel, and wherein the first side is opposite to the second side.

33. The electronic apparatus according to claim 28, wherein the pixel and the third phase difference detection pixel are in a specific location.

34. The electronic apparatus according to claim 28, wherein groups of phase difference detection pixels of the plurality of phase difference detection pixels are located in at least one non-imaging region located at a side of the pixel region.

35. The electronic apparatus according to claim 28, wherein at least one phase difference detection pixel of the plurality of phase difference detection pixels has a plurality of photoelectric conversion sections.

36. The electronic apparatus according to claim 28, wherein the center portion of the pixel region comprises a center portion of the periphery of the pixel region.

* * * * *